(12) United States Patent
Yokokawa

(10) Patent No.: US 8,234,555 B2
(45) Date of Patent: Jul. 31, 2012

(54) DATA DECODING APPARATUS, DATA DECODING METHOD, DATA TRANSMITTING/RECEIVING SYSTEM, DATA RECEIVING APPARATUS, DATA RECEIVING METHOD AND PROGRAM

(75) Inventor: Takashi Yokokawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 957 days.

(21) Appl. No.: 12/253,324

(22) Filed: Oct. 17, 2008

(65) Prior Publication Data

US 2009/0106621 A1 Apr. 23, 2009

(30) Foreign Application Priority Data

Oct. 19, 2007 (JP) ................ P2007-272517

(51) Int. Cl.
*G06F 11/00* (2006.01)
(52) U.S. Cl. ........................ 714/786; 714/792
(58) Field of Classification Search ............. 714/752, 714/757, 786, 792
See application file for complete search history.

(56) References Cited

U.S. PATENT DOCUMENTS

| | | | | |
|---|---|---|---|---|
| 7,707,479 B2 * | 4/2010 | Niu et al. | ....................... | 714/758 |
| 7,747,934 B2 * | 6/2010 | Livshitz | ....................... | 714/800 |
| 7,805,652 B1 * | 9/2010 | Varnica | ....................... | 714/752 |
| 2003/0033570 A1 * | 2/2003 | Khannanov et al. | ....................... | 714/755 |
| 2004/0148560 A1 * | 7/2004 | Hocevar | ....................... | 714/801 |
| 2004/0153960 A1 * | 8/2004 | Eroz et al. | ....................... | 714/800 |
| 2004/0187129 A1 * | 9/2004 | Richardson | ....................... | 718/100 |
| 2005/0240853 A1 * | 10/2005 | Yokokawa et al. | ....................... | 714/752 |
| 2007/0089027 A1 * | 4/2007 | Lim et al. | ....................... | 714/758 |
| 2007/0283221 A1 * | 12/2007 | Kyung et al. | ....................... | 714/758 |
| 2007/0294607 A1 * | 12/2007 | Uchida et al. | ....................... | 714/758 |
| 2008/0250295 A1 * | 10/2008 | Yamagishi et al. | ....................... | 714/757 |
| 2009/0106620 A1 * | 4/2009 | Yokokawa | ....................... | 714/752 |
| 2009/0106625 A1 * | 4/2009 | Jun et al. | ....................... | 714/758 |
| 2009/0259915 A1 * | 10/2009 | Livshitz et al. | ....................... | 714/758 |
| 2009/0327847 A1 * | 12/2009 | Shen et al. | ....................... | 714/804 |
| 2010/0180176 A1 * | 7/2010 | Yosoku et al. | ....................... | 714/752 |

FOREIGN PATENT DOCUMENTS

| | | |
|---|---|---|
| JP | 2006-340016 | 12/2006 |
| JP | 2008-301152 | 12/2008 |
| WO | WO 2006-059688 | 6/2006 |

OTHER PUBLICATIONS

M. Karkooti et al., "Semi-Parallel Reconfigurable Architectures for Real-Time LDPC Decoding".
K. Shimizu et al., "Partially-Parallel LDPC Decoder Based on High-Efficiency Message-Passing Algorithm".

* cited by examiner

*Primary Examiner* — Joshua Lohn
(74) *Attorney, Agent, or Firm* — Frommer Lawrence & Haug LLP; William S. Frommer

(57) ABSTRACT

Disclosed herein is a decoding apparatus for decoding an LDPC (Low Density Parity Check) code received in a first format or a second format wherein a process to decode received values each obtained as a result of receiving the LDPC code in the first or second format includes at least F check-node processes carried out concurrently as processes of F check nodes respectively or F variable-node processes carried out concurrently as processes of F variable nodes respectively.

8 Claims, 13 Drawing Sheets

FIG.1

$$H = \begin{bmatrix} & & & \vdots & & & & & \\ \cdots 1 \cdots 1 \cdot & 1 & \cdots \cdots 1 \cdots 1 \cdots 1 \\ & & & \vdots & & & & & \\ & & & 1 & & & & & \\ & & & \vdots & & & & & \\ & & & 1 & & & & & \\ & & & \vdots & & & & & \end{bmatrix}$$

FIG.2

INFORMATION PORTION      PARITY PORTION $$H = \begin{bmatrix} 1 & & 1 & & 1 & & 1 & & 1 & & & & \\ & 1 & & 1 & & 1 & & 1 & 1 & 1 & & 0 & \\ & & & \vdots & & & & & & \vdots & & & \ddots \end{bmatrix}$$

CHECK NODE

VARIABLE NODE

|   | ⓪ | ① | ② | ③ | ④ | ⑤ |
|---|---|---|---|---|---|---|
| 0 | 0 | 1 | 0 | 0 | 0 | 0 |
| 1 | 0 | 0 | 1 | 0 | 0 | 0 |
| 2 | 0 | 0 | 0 | 1 | 0 | 0 |
| 3 | 0 | 0 | 0 | 0 | 1 | 0 |
| 4 | 0 | 0 | 0 | 0 | 0 | 1 |
| 5 | 1 | 0 | 0 | 0 | 0 | 0 |

FIG.14

|   | ⓪ | ② | ④ | ① | ③ | ⑤ |
|---|---|---|---|---|---|---|
| 0 | 0 | 0 | 0 | 1 | 0 | 0 |
| 2 | 0 | 0 | 0 | 0 | 1 | 0 |
| 4 | 0 | 0 | 0 | 0 | 0 | 1 |
| 1 | 0 | 1 | 0 | 0 | 0 | 0 |
| 3 | 0 | 0 | 1 | 0 | 0 | 0 |
| 5 | 1 | 0 | 0 | 0 | 0 | 0 |

|   | ⓪ | ③ | ① | ④ | ② | ⑤ |
|---|---|---|---|---|---|---|
| [0] | 0 | 0 | 1 | 0 | 0 | 0 |
| [3] | 0 | 0 | 0 | 1 | 0 | 0 |
| [1] | 0 | 0 | 0 | 0 | 1 | 0 |
| [4] | 0 | 0 | 0 | 0 | 0 | 1 |
| [2] | 0 | 1 | 0 | 0 | 0 | 0 |
| [5] | 1 | 0 | 0 | 0 | 0 | 0 |

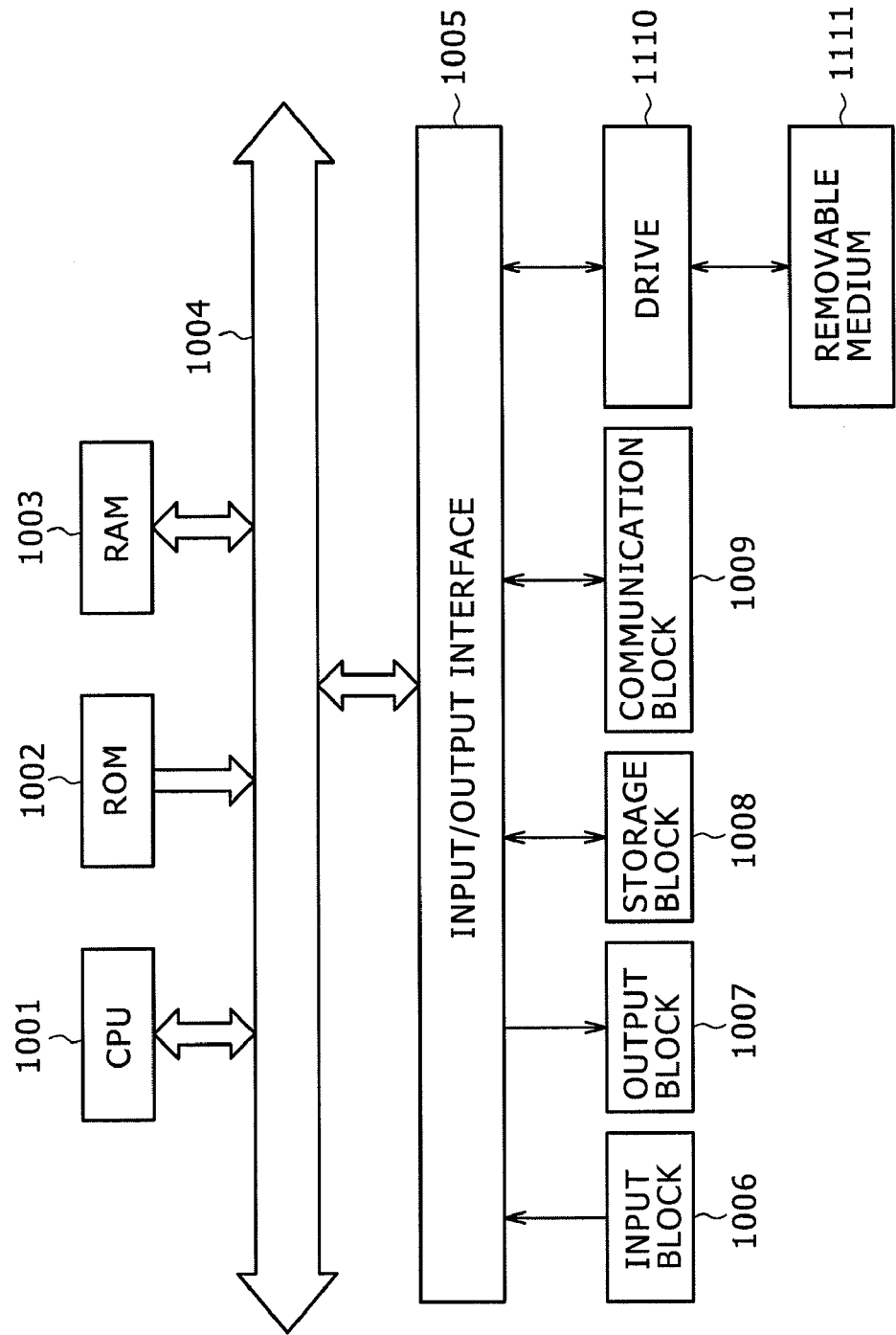

DATA DECODING APPARATUS, DATA DECODING METHOD, DATA TRANSMITTING/RECEIVING SYSTEM, DATA RECEIVING APPARATUS, DATA RECEIVING METHOD AND PROGRAM

CROSS REFERENCES TO RELATED APPLICATIONS

The present invention contains subject matter related to Japanese Patent Application JP 2007-272517 filed in the Japan Patent Office on Oct. 19, 2007, the entire contents of which being incorporated herein by reference.

BACKGROUND OF THE INVENTION

1. Field of the Invention

The present invention relates to decoding apparatuses, data decoding methods, data transmitting/receiving systems, data receiving apparatuses, data receiving methods and programs. More particularly, the present invention relates to a decoding apparatus, a data decoding method, a data transmitting/receiving system, a data receiving apparatus, a data receiving method and a program capable of decoding a plurality of LDPC (Low Density Parity Check) codes having structures different from each other and has a small circuit size.

2. Description of the Related Art

A communication system adopts a coding technique in order to carry out a reliable communication through a communication channel having noises. In a wireless system (or a radio system) such as a satellite network for example, there are many noise sources attributed to geographical and environmental causes. Each of communication channels can be regarded as a channel having a fixed capacitance, can be regarded as a channel capable of representing the number of bits per symbol at a certain SNR (Signal to Noise Ratio) and prescribes a theoretical upper limit which is known as a Shannon limit. For this reason, the coding design has an objective to achieve a rate approaching the Shannon limit. This objective has a particularly close relation with a limited-bandwidth satellite system.

In recent years, there have been developed coding methods each exhibiting a performance close to the Shannon limit. Each of the coding methods is also referred to as the so-called turbo coding technique adopted in a coding process based on turbo codes such as PCCCs (Parallel Concatenated Convolutional Codes) and SCCCs (Serially Concatenated Convolutional Codes). While these turbo codes are being developed, LDPC codes (Low Density Parity Check codes) has been drawing much attention. The LDPC codes are codes used in a coding method which has been known from a long time ago.

The LDPC code was first proposed by R. G. Gallager in "Low Density Parity Check Codes," Cambridge, Mass., MIT Press, 1963. Thereafter, the LDPC code again drew attention as described in D. J. C Mackay, "Good error correcting codes based on very parse matrices," submitted to IEEE Trans. Inf. Theory, IT-45, pp. 399-431, 1999 and M. G. Luby, M. Mitzenmacher, M. A. Shokrollahi and D. A. Spielman, "Analysis of low density codes and improved designs using irregular graphs," in Proceedings of ACM Symposium on Theory of Computing, pp. 249-258, 1998.

Results of research conducted in recent years have been gradually indicating that, in the case of the LDPC code, by increasing the code length, it is possible to demonstrate a performance close to the Shannon limit in the same way as the turbo code. In addition, the LDPC code has a property showing that the minimum distance is proportional to the code length. Thus, the LDPC code is characterized in that the LDPC code offers merits of a good block error probability characteristic and all but no occurrence of the so-called error floor phenomenon almost. The error floor phenomenon is a phenomenon observed in a decoding characteristic of codes such as the turbo code.

The LDPC code is explained concretely as follows. It is to be noted that the LDPC code is a linear code and is not necessarily a two-dimensional code. In the following description, however, the LDPC code is explained as a two-dimensional code.

The most prominent characteristic of the LDPC code is that a parity check matrix defining the LDPC code is a sparse matrix. The sparse matrix is a matrix in which the number of elements each having a value of 1 is very small. Let notation H denote the sparse parity check matrix. FIG. 1 is a diagram showing a typical sparse parity check matrix H. As shown in the diagram of FIG. 1, the Hamming weight of each column is three whereas the Hamming weight of each row is six. The Hamming weight of a column or a row is the number of matrix elements each included in a column or a row as an element each having a value of 1.

An LDPC code defined by a parity check matrix H having a constant Hamming weight for each column and a constant Hamming weight for each row as described above is referred to as a regular LDPC code. On the other hand, an LDPC code defined by a parity check matrix H having a Hamming weight varying from column to column and a Hamming weight varying from row to row is referred to as an irregular LDPC code.

A coding process based on such an LDPC code is carried out by creating a generated matrix G on the basis of the parity check matrix H defining the LDPC code. Then, the generated matrix G is multiplied by a two-dimensional information message u in order to produce a coded word c. To put it concretely, a coding apparatus for carrying out a coding process based on the LDPC code creates a generated matrix G for which the equation $GH^T=0$ holds true with respect to a rearranged matrix $H^T$ derived from the parity check matrix H defining the LDPC code. If the generated matrix G is a k×n matrix, the coding apparatus then multiplies the generated matrix G by an information message of k bits in order to produce a coded word c (=uG) composed of n bits. In the following description, the information message composed of k bits is also referred to as a vector u. The coding apparatus finally transmits the coded word c by mapping each coded-word bit having a value of 0 onto +1 and each coded-word bit having a value of 1 onto −1 to a receiver through a communication line determined in advance. In a word, the coding apparatus encodes the information message u into the coded word c on the basis of the LDPC code defined by the parity check matrix H.

It is to be noted that, if the coded word c composed of n bits is an organization code matching an n-bit sequence composed of an information message of k bits followed by (n−k) parity bits for example, in the (n−k)-row×n-column parity check matrix H composed of (n−k) rows and n columns as shown in a diagram of FIG. 2, the (n−k)-row×k-column matrix portion corresponding to the k-bit information message u of the coded word composed of n bits is referred to as an information portion whereas the (n−k)-row×(n−k)-column matrix portion corresponding to the (n−k) parity bits of the coded word composed of n bits is referred to as a parity portion. If the parity portion is a lower triangular matrix or an upper triangular matrix, the process to code the information message u by adoption of the coding method based on the LDPC code is carried out by making use of the parity check matrix H defining the LDPC code.

That is to say, as shown in the diagram of FIG. 2, the parity check matrix H includes the information portion and a lower triangle matrix serving as the parity portion whereas every element of the lower triangle matrix serving as the parity portion is 1. In this case, the sequence of parity bits is found as follows. First of all, the first parity bit of the parity-bit sequence of the coded word c has a value obtained as a result of carrying out an EXOR (exclusive logical sum) process on bits each included in the information message u as a bit corresponding to a matrix element included in the first row of the information portion of the parity check matrix H as an element having a value of 1.

Then, the second parity bit of the parity-bit sequence of the coded word c has a value obtained as a result of carrying out an EXOR process on the first parity bit of the parity-bit sequence and message bits each included in the information message u as a bit corresponding to a matrix element included in the second row of the information portion of the parity check matrix H as an element having a value of 1.

Subsequently, the third parity bit of the parity-bit sequence of the coded word c has a value obtained as a result of carrying out an EXOR process on the first and second parity bits of the parity-bit sequence and message bits each included in the information message u as a bit corresponding to a matrix element included in the third row of the information portion of the parity check matrix H as an element having a value of 1.

Thereafter, the fourth and subsequent parity bits of the parity-bit sequence are found in the same way. Speaking generally, the ith parity bit of the parity-bit sequence of the coded word c has a value obtained as a result of carrying out an EXOR process on the first to (i−1)th parity bits of the parity-bit sequence and message bits each included in the information message u as a bit corresponding to a matrix element included in the ith row of the information portion of the parity check matrix H as an element having a value of 1.

The (n−k) parity bits of the parity-bit sequence are computed as described above and the parity-bit sequence is then put at a location following the information message composed of k bits in order to generate a coded word c composed of n bits.

On the other hand, a decoding process making use of an LDPC code can also be carried out in accordance with a message passing algorithm based on belief propagations on the so-called Tanner graph composed of variable nodes also each referred to as a message node and check nodes. The message passing algorithm is an algorithm proposed by Gallager as an algorithm called probabilistic decoding. Hereinunder the variable nodes and check nodes are simply referred to as nodes, arbitrarily.

In the case of the probabilistic decoding algorithm, however, a message passed between nodes is a real value. Thus, in order to analytically solve the message, it is necessary to track the probability distribution of the message which has a continuous value. That is to say, it is necessary to carry out an extremely difficult analysis. In order to resolve this problem, Gallager has proposed algorithms A and B as algorithms each used for decoding an LDPC code or, strictly speaking, decoding data already encoded by making use of an LDCP code.

The decoding processing to decode data coded by making use of an LDPC code is typically carried out in accordance with a procedure represented by a flowchart shown in FIG. 3. In the following description, the processing to decode the data coded by making use of an LDPC code is also referred to simply as a process to decode an LDPC code whereas an LDPC code serving as a subject of decoding means data already encoded by making use of an LDPC code. It is to be noted that, in the procedure, notation $U_0$ ($u_{0i}$) denotes the ith value of received data coded on the basis of the LDPC code having a certain code length, notation $u_j$ denotes the jth message output from a check node or, strictly speaking, a message output from a jth edge connected to the check node whereas notation $v_i$ denotes the ith message output from a variable node or, strictly speaking, a message output from an ith edge connected to the variable node. In addition, in this case, a message is a real value used for expressing the so-called log likelihood ratio or the like as a value representing the likelihood of the value 0.

As shown in FIG. 3, the flowchart representing the procedure of the decoding processing begins with a step S101 at which a data value $U_0$ ($u_{0i}$) is received whereas each of a message $u_j$ and a variable k is initialized to 0. The variable k is an integer representing the number of repetitive processing. Then, the flow of the decoding process goes on to a step S102. At the step S102, the received data value $U_0$ ($u_{0i}$) is used in conjunction with messages $u_j$ for carrying out a process at a variable node in accordance with Eq. (1) in order to find a message $v_i$. Then, the message $v_i$ is used for carrying out a process at a check node in accordance with Eq. (2) in order to find a message $u_j$.

$$v_i = u_{0i} + \sum_{j=1}^{d_v-1} u_j \quad (1)$$

$$\tanh\left(\frac{u_j}{2}\right) = \prod_{i=1}^{d_c-1} \tanh\left(\frac{v_i}{2}\right) \quad (2)$$

Notation $d_v$ used in Eq. (1) denotes a parameter representing the number of elements each having a value of 1 in the vertical (or column) direction whereas notation $d_c$ used in Eq. (2) denotes a parameter representing the number of elements each having a value of 1 in the horizontal (or row) direction. That is to say, notations $d_v$ and $d_c$ denote parameters representing the Hamming weight of each column and the Hamming weight of each row respectively. The values of these parameters $d_v$ and $d_c$ can be arbitrarily selected. In the case of a code (3, 6) for example, the value of the Hamming weight of each column is set at 3 (that is, $d_v$=3) whereas the value of the Hamming weight of each row is set at 6 (that is, $d_c$=6).

It is to be noted that, in the summation process according to Eq. (1), a message input from an edge making an attempt to output a message is not used as a subject of the process. Thus, the range of the summation process starts from 1 and ends at ($d_v$−1). By the same token, in the multiplication process according to Eq. (2), a message input from an edge making an attempt to output a message is not used as a subject of the process. Thus, the range of the multiplication process starts from 1 and ends at ($d_c$−1). In addition, the multiplication process to find the value of the message $u_j$ in accordance with Eq. (2) can be carried out in accordance with Eqs. (3) and (4) as follows. A table of values 1 of a function R ($v_1$, $v_2$) for two given inputs $v_1$ and $v_2$ is created in advance as a table according to Eq. (3). As indicated by Eq. (3), the value x of the function R ($v_1$, $v_2$) is a function of inputs $v_1$ and $v_2$. Then, the value of the message $u_j$ can be found by using the value x, which is found from the table, in a recursive manner according to Eq. (4).

$$x = 2\tan h^{-1}\{\tan h(v_1/2)\tan h(v_2/2)\} = R(v_1, v_2) \quad (3)$$

$$u_j = R(v_1, R(v_2, R(v_3, \ldots R(V_{d_c-2}, v_{d_c-1})))) \quad (4)$$

In addition, at the step S102, the variable k is incremented by 1. Then, the flow of the decoding process goes on to a step S103. At the step S103, the variable k is compared with a repetitive decoding count N determined in advance in order to produce a result of determination as to whether or not the variable k is equal to or greater than the repetitive decoding count N. If the determination result produced by the process carried out at the step S103 indicates that the variable k is neither equal to nor greater than the repetitive decoding count N determined in advance, the flow of the decoding process goes back to the step S102 to repeat the processes of the steps S102 and S103.

If the determination result produced by the process carried out at the step S103 indicates that the variable k is either equal to or greater than the repetitive decoding count N determined in advance, on the other hand, the flow of the decoding process goes on to a step S104 at which a message v is found by carrying out a process according to Eq. (5) as a decoding result to be output eventually. Then, the decoding processing to decode data coded by making use of an LDPC code is ended.

$$v_i = u_{0i} + \sum_{j=1}^{d_v} u_j \quad (5)$$

The computation process according to Eq. (5) is different from the computation process according to Eq. (1) in that the computation process according to Eq. (5) is carried out by making use of messages $u_j$ from all edges connected to the variable node.

In the decoding processing to decode data coded by making use of an LDPC code, in the case of a (3, 6) code for example, messages are exchanged between nodes as shown in a diagram of FIG. 4. It is to be noted that, in the diagram of FIG. 4, each node indicated by the "=" equal symbol is a variable node at which the summation process according to Eq. (1) is carried out. On the other hand, each node indicated by the "+" plus operator is a check node at which the multiplication process according to Eq. (2) is carried out.

Particularly, in accordance with algorithm A cited earlier, a message is made two dimensional and, at a check node indicated by the "+" plus operator, an exclusive logical sum process is carried out on $(d_c-1)$ input messages $v_i$ which are supplied to the check node whereas, at a variable node indicated by the "=" equal symbol, the sign of received data R is inverted before the data R is output if $(d_v-1)$ input messages $u_j$ supplied to the variable node have all different bit values.

In addition, in recent years, research on implementation of a method for performing a process to decode data coded by making use of an LDPC code is carried out. Before the method for carrying out processing to decode data coded by making use of an LDPC code is described, first of all a model of the processing to decode data coded by making use of an LDPC code is created and explained.

FIG. 5 is a diagram showing a typical parity check matrix H defining the LDPC code of a (3, 6) code as an LDPC code having an encoding ratio of 1/2 and a code length of 12. The parity check matrix H shown in the diagram of FIG. 5 as a matrix defining the LDPC code can be expressed by a Tanner graph like one shown in a diagram of FIG. 6. In the diagram of FIG. 6, each node indicated by the "=" equal symbol is a variable node whereas each node indicated by the "+" plus operator is a check node. The check and variable nodes correspond to the rows and the columns in the parity check matrix H. A line connecting a check node and a variable node to each other is referred to as an edge which corresponds to a matrix element having a value of 1. That is to say, if a matrix element at an intersection existing in the parity check matrix H as an intersection of the jth row and the ith column has a value of 1, the ith variable node from the top of the diagram of FIG. 6 (that is, the ith node indicated by the "=" equal notation) and the jth check node from the top of the diagram of FIG. 6 (that is, the jth node indicated by the "+" plus operator) are connected to each other by an edge corresponding to the intersection at which the matrix element has a value of 1. An edge connecting a variable node and a check node to each other indicates that the bit included in the received data coded by making use of an LDPC code as a bit associated with the variable node has a condition of constraint with respect to the check node. It is to be noted that the Tanner graph shown in the diagram of FIG. 6 expresses the parity check matrix H shown in the diagram of FIG. 5 as described above.

A Sum Product Algorithm serving as the method for decoding data coded by making use of an LDPC code is an algorithm for carrying out the processes of the variable and check nodes repeatedly.

At a variable node, the summation process represented by Eq. (1) as the process of a variable node is carried out as shown in the diagram of FIG. 7. In the summation process shown in the diagram of FIG. 7, a message $v_i$ corresponding to the ith edge existing among edges connected to the variable node is computed from messages $u_1$ and $u_2$ coming from the remaining edges connected to the variable node and received data value $u_{0i}$. A message corresponding to any other edge is also computed in the same way.

Before the process carried out at a check node is explained, Eq. (2) is rewritten into Eq. (6) by making use the relation a×b=exp {ln(|a|)+ln(|b|)} sign(a)×sign(b) where sign(x) has a value of 1 (or the logic value of 0) for x≧0 or a value of −1 (or the logic value of 1) for x<0.

$$u_j = 2\tanh^{-1}\left(\prod_{i=1}^{d_c-1} \tanh\left(\frac{v_i}{2}\right)\right) \quad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

In addition, for x≧0, let us define a nonlinear function $\phi(x) = -\ln(\tan h(x/2))$. In this case, the inverse function $\phi^{-1}(x)$ of the nonlinear function $\phi(x)$ can be expressed as follows: $\phi^{-1}(x) = 2\tan h^{-1}(e^{-x})$. Thus, Eq. (6) can be rewritten into Eq. (7) from the equation $\phi^{-1}(x) = 2\tan h^{-1}(x)(e^{-x})$ as follows:

$$u_j = \phi^{-1}\left(\sum_{i=1}^{d_c-1} \phi(|v_i|)\right) \times \prod_{i=1}^{d_c-1} \text{sign}(v_i) \quad (7)$$

At a check node, a check-node process according to Eq. (7) is carried out as shown in the diagram of FIG. 8. In the multiplication process shown in the diagram of FIG. 8, a message $u_j$ corresponding to the jth edge existing among edges connected to the check node is computed from messages $v_1, v_2, v_3, v_4$ and $v_5$ coming from the remaining edges connected to the check node. A message corresponding to any other edge is also computed in the same way.

It is to be noted that the nonlinear function φ(x) can also be expressed as follows: φ(x)=ln((e^x+1)/(e^x−1)). In this case, for x>0, φ(x)=φ⁻¹(x). That is to say, the processing result of execution of the nonlinear function φ(x) is equal to the processing result of execution of the inverse function φ⁻¹(x) of the nonlinear function φ(x). In actuality, hardware is used for implementing each of the nonlinear function φ(x) and the inverse function φ⁻¹(x) of the nonlinear function φ(x). The hardware used for implementing each of the nonlinear function φ(x) and the inverse function φ⁻¹(x) of the nonlinear function φ(x) is typically a LUT (Look Up Table). Thus, in this case, a LUT common to the nonlinear function φ(x) and the inverse function φ⁻¹(x) of the nonlinear function φ(x) can be used.

In addition, the process carried out at a variable node as the summation process according to Eq. (1) can be divided into the summation process according to Eq. (5) and a subtraction process according to Eq. (8).

$$v_i = v - u_{d_v} \quad (8)$$

Thus, by repeating the processes according to Eqs. (5) and (8), the process of a variable node can be repeated, that is, the variable-node process according to Eq. (1) can be repeated. By the same token, by repeating the process according to Eq. (7), the process of a check node can be repeated. In this case, the result of the last process according to Eq. (8) obtained as a result of repeating the processes according to Eqs. (5) and (8) can be used as it is as the final result of the decoding processing.

If the Sum Product Algorithm is implemented by hardware as an algorithm for a decoding apparatus, it is necessary to repeat the variable-node process and the check-node process at an appropriate operating frequency by making use a circuit having a proper size. The variable-node process is the process carried out at every variable node in accordance with Eq. (1) or Eqs. (5) and (8) whereas the check-node process is the process carried out at every check node in accordance with Eq. (7).

An example of such a decoding apparatus is explained as follows.

The algorithm used for decoding data coded by making use of an LDPC code is characterized in that the algorithm allows a full parallel-processing decoding apparatus with a very high performance to be implemented. However, the full parallel-processing decoding apparatus intended for data with a large code length has an extremely large circuit size so that it is difficult to implement the apparatus.

In order to solve this problem, in recent years, there has been proposed an LDPC code having a structure suitable for implementation of a decoding apparatus having a practical circuit size as an LDPC code to be used in a communication system such as DVB-S.2 (ETSI EN302307). For this reason, the proposed LDPC code is referred to as DVB-S.2 LDPC code in the following description.

The DVB-S.2 LDPC code can be defined by a matrix having a structure obtained by rearranging the rows and the columns in the parity check matrix as described below.

That is to say, the DVB-S.2 LDPC code can be expressed by a parity check matrix having a structure obtained by combining a plurality of configuration matrixes which include a P×P unit matrix (where P=360), a P×P semi unit matrix, a P×P shift matrix, a P×P sum matrix and a P×P zero matrix. A semi unit matrix is a unit matrix in which each of one or more matrix elements each having a value of 1 is set at 0. A shift matrix is a matrix obtained as a result of carrying out a cyclic shift operation on a unit matrix or a semi unit matrix. A sum matrix is a matrix obtained by carrying out a matrix addition operation on at least two of the unit matrix, the semi unit matrix and the shift matrix. It is to be noted that, in the following description, the parity check matrix having such a structure is referred to as a parity check matrix composed of configuration matrixes each having a P×P structure whereas an LDPC code defined by a parity check matrix composed of configuration matrixes each having a P×P structure is referred to as a P code.

By making use of such a P code, it is possible to implement a decoding apparatus for simultaneously processing P bits representing P received values respectively and P bits representing P messages respectively.

In order to make the following explanation easy to understand, however, the explanation is given for P=6. FIG. 9 is a diagram showing a parity check matrix H defining an LDPC code with a coding ratio of 2/3 and a code length of 108. The parity check matrix H shown in the diagram of FIG. 9 is a typical parity check matrix composed of configuration matrixes each having a 6×6 structure. In order to make each of the configuration matrixes each having a 6×6 structure easy to recognize, gaps are provided between the 6×6 configuration matrixes in the parity check matrix H shown in the diagram of FIG. 9. In order to make the diagram of FIG. 9 easy to look at, each of the matrix elements each having a value of 0 in the parity check matrix H is represented by a period ".". That is to say, the parity check matrix shown in the diagram of FIG. 9 has a structure obtained by combining a plurality of configuration matrixes which include 6×6 unit matrixes, 6×6 semi unit matrixes, 6×6 shift matrixes, 6×6 sum matrixes and a 6×6 zero matrixes. As described earlier, a semi unit matrix is a unit matrix in which each of one or more matrix elements each having a value of 1 is set at 0.

FIG. 10 is a block diagram showing a typical related-art decoding apparatus for decoding data coded by making use of an LDPC code described above as an LDPC code for P=6.

The configuration of the typical decoding apparatus shown in the block diagram of FIG. 10 includes a received-value buffer 200, a received-value storage memory 201, a node processing section 202, a shift section 203, a message storage memory 204 and a decoding-result storage memory 205.

The received-value buffer 200 is a buffer for storing data D200 received from a communication line as data having a size of one code before the data D200 is transferred to the received-value storage memory 201 as data D201. Depending on a transmission method for transmitting the data D200 to the received-value buffer 200, a process to rearrange code bits of the data D200 stored in the received-value buffer 200 may be carried out in some cases.

The data D201 is read out from the received-value storage memory 201 in accordance with the order of the columns of the parity check matrix H shown in the diagram of FIG. 9 at the same time in six-piece units with each piece composed of 6 bits. That is to say, the data D201 is read out from the received-value storage memory 201 in units which are each a matrix composed of six rows and six columns and supplied to the node processing section 202 as received data D202.

The node processing section 202 employs six node processors denoted by reference numerals 210-1 to 210-6 respectively. Each of the six node processors 210-1 to 210-6 carries out the check-node process or the variable-node process on a predetermined one of six pieces of data D202 read out from the received-value storage memory 201 and a predetermined one of six messages D205 received from the message storage memory 204 at the same time in accordance with a command issued by a control section not shown in the block diagram of FIG. 10 and outputs messages D203 to the shift section 203 as results of the processes. That is to say, the node processors 210-1 to 210-6 supply six messages D203 respectively to the shift section 203 as results of the processes carried out concurrently. In addition, the node processors 210-1 to 210-6 also output respectively six decoding results D206 of the variable-node processes carried out by the node processors 210-1 to 210-6 at the same time to the decoding-result storage memory 205 simultaneously.

When the node processors 210-1 to 210-6 employed in the node processing section 202 supply six messages D203 respectively to the shift section 203, a control section not shown in the block diagram of FIG. 10 provides the shift section 203 with information indicating that edges corresponding to the six messages D203 are each an edge for which some cyclic shift operations have been carried out on a configuration matrix such as a unit matrix serving as an element matrix of the parity check matrix H shown in the diagram of FIG. 9. On the basis of this information, the shift section 203 carries out a cyclic shift operation to rearrange the six messages D203 and outputs six messages D204 to the message storage memory 204 as a result of the operation.

In the message storage memory 204, the 6 messages D204 received from the shift section 203 are stored at an address specified by a control section not shown in the block diagram of FIG. 10. The message storage memory 204 outputs six pieces of data read out from an address specified by a control section not shown in the block diagram of FIG. 10 to the node processing section 202 as six messages D205.

The decoding-result storage memory 205 is used for storing the six decoding results D206 of the variable-node processes carried out by the node processors 210-1 to 210-6 of the node processing section 202 at the same time. The six decoding results D206 are actually data of 6 bits. After the decoding processing is completed, the data of 6 bits is output as a decoding result D207.

It is to be noted that, by properly controlling the order to write data into each of the memories, the order to read out data from each of the memory and the shift quantity, the typical decoding apparatus shown in the block diagram of FIG. 10 is capable of decoding not only single code but also other code having identical structures.

FIG. 11 is a block diagram showing a typical configuration of each of the six node processors 210-1 to 210-6 employed in the node processing section 202. In the following, if it is not necessary to distinguish the six node processors 210-1 to 210-6 from each other, each of the six node processors 210-1 to 210-6 is denoted merely by a generic reference numeral 210.

The node processor 210 having a typical configuration shown in the block diagram of FIG. 11 is capable of carrying out the variable-node process according to Eq. (1) and the check-node process according to Eq. (7) alternately by switching the process from one to the other.

The node processor 210 has two input ports P301 and P302 each used for receiving a message or data from an external source. To be more specific, in the typical decoding apparatus shown in the block diagram of FIG. 10, the input port P301 is a port used for receiving data D202 from the received-value storage memory 201 whereas the input port P302 is a port used for receiving a message D205 from the message storage memory 204.

In addition, the node processor 210 also has two output ports P303 and P304 each used for outputting a message or a process result. To be more specific, in the typical decoding apparatus shown in the block diagram of FIG. 10, the output port P303 is a port used for outputting a message D203 to the shift section 203 whereas the output port P304 is a port used for supplying a decoding result D206 to the decoding-result storage memory 205.

On top of that, the node processor 210 also employs selectors 301, 316 and 318 which each have V and C input terminals. With each of the selectors 301, 316 and 318 selecting the V input terminal, the node processor 210 carries out the variable-node process. With each of the selectors 301, 316 and 318 selecting the C input terminal, on the other hand, the node processor 210 carries out the check-node process.

First of all, the variable-node process carried out by the node processor 210 serving as a variable node is explained.

The node processor 210 receives one-column messages D205 originated by check nodes from the message storage memory 204 of the typical decoding apparatus shown in the block diagram of FIG. 10 through the input port P302. The messages D205 are sequentially supplied to the selector 301 one message after another as messages D301 (or messages $u_j$). The selector 301 supplies the message D301 as a message D306 to an adder 302. The adder 302 also receives data D323 output by a selector 317. The adder 302 adds the data D323 output by the selector 317 to the message D306 output by the selector 301 in order to produce a sum which is then stored in a register 303.

If the selector 317 has selected its input terminal connected to the register 303 outputting data D307, the adder 302 adds the data D307 supplied by the register 303 to the adder 302 by way of the selector 317 to the message D306 output by the selector 301 in order to produce a sum which is then again stored in the register 303.

If the selector 317 has selected its input terminal connected to the selector 318 outputting data D322, on the other hand, the adder 302 adds the data D322 supplied by the selector 318 to the adder 302 by way of the selector 317 to the message D306 output by the selector 301 in order to produce a sum. By the way, the data D322 output by the selector 318 is data D202 (or $u_{0i}$) received by the input port P301 as data D300. Thus, the adder 302 adds the received data D202 (or $u_{0i}$) to the message D306 output by the selector 301 in order to produce a sum which is stored in the register 303.

As the operations described above are repeated for one column, data D307 having an amount equal to $\Sigma u_j + u_{0i}$ with the summation $\Sigma u_j$ covering a range of j=1 to $d_v$ is accumulated in the register 303. The data D307 having an amount equal to $\Sigma u_j + u_{0i}$ is then transferred to a register 305 by way of a selector 304.

In the mean time, a delay FIFO 310 is used for delaying the message D306 output by the selector 301 as a message originated from a check node by keeping the message D306 in the delay FIFO 310 till new data D308 having an amount equal to $\Sigma u_j + u_{0i}$ with the summation $\Sigma u_j$ covering a range of j=1 to $d_v$ is output by the register 305. The delay FIFO 310 then outputs the delayed message D306 to a subtractor 312 as a delayed input message D315.

The subtractor 312 subtracts the delayed input message D315 output by the delay FIFO 310 from the new data D308 output by the register 305 in order to produce a difference D316 having a magnitude equal to $\Sigma u_j + u_{0i}$ with the summation $\Sigma u_j$ covering a range of j=1 to $(d_v-1)$. The subtractor 312 outputs the difference D316 to a selector 316. Then, the selector 316 outputs the difference D316 to the output port P303 as a message D321. Finally, the output port P303 passes on the message D321 as an output message D203 to the shift section 203 employed in the typical decoding apparatus shown in the block diagram of FIG. 10.

In other words, when carrying out the process of a variable node in accordance with Eq. (1), the node processor 210 serving as the variable node computes a message to be output to a specific check node through an edge by subtracting a message supplied by the specific check node from a sum of messages received from all check nodes connected to the node processor 210 serving as the variable node and the received data.

Next, the check-node process carried out by the node processor 210 serving as a check node is explained.

The node processor 210 receives one-row messages D205 originated by variable nodes from the message storage memory 204 of the typical decoding apparatus shown in the block diagram of FIG. 10 through the input port P302. The messages D205 are sequentially passed on by the input port P302 one message after another as messages D301 (or messages $v_i$) and supplied to an LUT 300 as absolute values D303 (or $|v_i|$).

The LUT 300 is an LUT for storing values of a nonlinear function $\phi(x)$ used in Eq. (7) expressing the check-node process as values each associated with an argument x which is the absolute value D303 (or $|v_i|$). That is to say, the LUT 300 is used for storing values D305 (or $\phi(|v_i|)$). When an absolute value D303 (or $|v_i|$) is supplied to the LUT 300, the LUT 300 outputs a value D305 (or $\phi(|v_i|)$).

The value D305 (or $\phi(|v_i|)$) read out from the LUT 300 is supplied to the adder 302 by way of the selector 301 as a message D306. The adder 302 adds the message D306 output by the selector 301 to data D323 output by the selector 317 in order to produce a sum which is then stored in the register 303. In this case, the selector 317 has selected its input terminal connected to the register 303 outputting data D307. Thus, the adder 302 adds the data D307 supplied by the register 303 to the adder 302 by way of the selector 317 to the message D306 output by the selector 301 in order to produce a sum which is then again stored in the register 303. Thus, the data D307 is a cumulative sum of the values D305 (or $\phi(|v_i|)$).

As values D305 (or $\phi(|v_i|)$) read out from the LUT 300 for messages D301 (or messages $v_i$) for one row are cumulatively summed up to produce a one-line cumulative sum D307, the sum D307 having a magnitude equal to $\Sigma\phi(|v_i|)$ computed over a range of i=1 to $d_c$ is supplied to the register 305 by way of the selector 304.

In the mean time, the delay FIFO 310 is used for delaying the message D306 output by the selector 301 by keeping the message D306 in the delay FIFO 310 till new data D308 having an amount equal to $\Sigma\phi(|v_i|)$ computed over a range of i=1 to $d_c$ is output by the register 305. That is to say, the delay FIFO 310 is used for delaying the value D305 (or $\phi(|v_i|)$) read out from the LUT 300. The delay FIFO 310 then outputs the delayed value D305 to the subtractor 312 as a delayed input message D315.

The subtractor 312 subtracts the delayed input message D315 from the new data D308 output by the register 305 in order to produce a difference D316 having a magnitude equal to $\Sigma\phi(|v_i|)$ computed over a range of i=1 to ($d_c$−1). The subtractor 312 then outputs the difference D316 to an LUT 314.

The LUT 314 is an LUT which works as follows. In the LUT 314, the difference D316 is treated as an argument x. For the argument x, the value of the inverse function $\phi^{-1}(x)$ used in the check-node process according to Eq. (7) as the inverse function $\phi^{-1}(x)$ of the nonlinear function $\phi(x)$ is read out from the LUT 314. To put in detail, when the subtractor 312 provides the LUT 314 with the difference D316 having a magnitude equal to $\Sigma\phi(|v_i|)$ computed over a range of i=1 to ($d_c$−1), the LUT 314 outputs a value D318 (=$\phi^{-1}(\Sigma\phi(|v_i|))$) which is the value of the inverse function $\phi^{-1}(\Sigma\phi(|v_i|))$.

Concurrently with the operations described above, an EXOR circuit 306 carries out an exclusive logical sum process on the sign bit D304 (or a sign($v_i$)) of each message D301 (or each message $v_i$) and a value D310 stored in a register 307 in order to produce a logical sum D309 and again stores the sum D309 in the register 307. The sign bit D304 of a message D301 is a bit indicating whether the message D301 is a positive or negative message.

As the sign bits of messages D301 (or messages $v_i$) for one row are cumulatively summed up by the EXOR circuit 306 and stored in the register 307, the register 307 supplies a cumulative value D310 represented by $\pi\text{sign}(v_i)$ computed over a range of i=1 to $d_c$ to a register 309 by way of a selector 308.

In the mean time, the delay FIFO 310 is used for delaying the sign bit D304 (or the sign($v_i$)) used in the multiplication by keeping the sign bit D304 (or the sign($v_i$)) in the delay FIFO 310 till new data D311 represented by $\pi\text{sign}(v_i)$ computed over a range of i=1 to $d_c$ is output by the register 309. The delay FIFO 310 then outputs the delayed sign bit D304 to an EXOR circuit 315 as a delayed sign bit D313.

The EXOR circuit 315 carries out an exclusive logical sum process on the delayed sign bit D313 received from the delay FIFO 310 and a cumulative value D311 stored in the register 309 in order to produce a sign bit D319 and supplies the sign bit D319 represented by $\pi\text{sign}(v_i)$ computed over a range of i=1 to ($d_c$−1) to the selector 316.

Finally, the selector 316 appends the sign bit D319 received from the EXOR circuit 315 to the value D318 (=$\phi^{-1}(\Sigma\phi(|v_i|))$) output by the LUT 314 in order to produce a message D321 and outputs the message D321 to the output port P303 which then passes on the message D321 to the shift section 203 of the typical decoding apparatus shown in the block diagram of FIG. 10.

In other words, when carrying out the process of a check node in accordance with Eq. (7), the node processor 210 computes a message to be output to a specific variable node through an edge by subtracting a message supplied by the specific variable node from a sum of messages received from all check nodes connected to the node processor 210 serving the check node.

At the final stage of decoding, the node processor 210 carries out a process according to Eq. (5) in place of the variable-node process according to Eq. (1) and outputs data D308 resulting from the process as a decoding result D206 to the decoding-result storage memory 205 of the typical decoding apparatus shown in the block diagram of FIG. 10 by way of the output port P304.

The final stage of decoding is typically the last variable-node process carried out after repeating the variable-node and check-node processes N times where N is an integer determined in advance.

It is to be noted that, even though the typical decoding apparatus shown in the block diagram of FIG. 10 is a decoding apparatus for decoding codes of P=6, a decoding apparatus for decoding P codes with P other than 6 can be basically designed to have a configuration identical with that of the typical decoding apparatus shown in the block diagram of FIG. 10.

SUMMARY OF THE INVENTION

If a decoding apparatus for decoding P codes is implemented to make use of the related-art technology and to have a configuration identical with that of the typical decoding apparatus shown in the block diagram of FIG. 10, however, P node processors connected in parallel are required instead of only six node processors connected in parallel. In addition, the shift section needs to carry out P×P cyclical shift operations instead of only 6×6 cyclical shift operations. On top of that, each of the memories must allow P pieces of data to be written into and read out from at the same time instead of only six pieces of data.

Thus, for a large value of P, there is raised a problem that the circuit size of the whole decoding apparatus undesirably increases.

In addition, the related-art decoding apparatus is not capable of decoding codes other than P codes. For example, the related-art decoding apparatus is not capable of decoding Q codes. Thus, codes used in one transmission system must be all P codes. As a result, there is undesirably raised another problem that, in a system typically making use of P codes intended for services oriented to stationary receivers each having a high transmission rate and Q codes intended for services oriented to portable receivers each having a low transmission rate but having a big limitation on the power consumption, a decoding apparatus dedicated to decoding P codes and a decoding apparatus dedicated to decoding Q codes must be designed separately from each other in order to configure a receiver common to the P and Q codes.

Addressing the problems described above, inventors of the present invention have proposed a decoding apparatus that is capable of decoding a plurality of codes provided with different structures and coded by making use of the LDPC code and makes it possible to reduce the circuit size thereof.

In accordance with an embodiment of the present invention, there is provided a decoding apparatus for decoding an LDPC (Low Density Parity Check) code received in:

a first format expressed by a first original parity check matrix having a first structure obtained by combining a plurality of first configuration matrixes including a P×P unit matrix, a P×P semi unit matrix obtained by setting the value of each of one or more matrix elements of the P×P unit matrix from 1 to 0, a P×P shift matrix obtained as a result of carrying out a cyclic shift operation on the P×P unit matrix or the P×P semi unit matrix, a P×P sum matrix obtained by carrying out a matrix addition operation on at least two of the P×P unit matrix, the P×P semi unit matrix and the P×P shift matrix and a P×P zero matrix or expressed by a first post-rearrangement matrix obtained by rearranging at least one row and one column in the first original parity check matrix as a matrix having the first structure where notation P denotes an integer; or a second format expressed by a second original parity check matrix having a second structure obtained by combining a plurality of second configuration matrixes including a Q×Q unit matrix, a Q×Q semi unit matrix obtained by setting the value of each of one or more matrix elements of the Q×Q unit matrix from 1 to 0, a Q×Q shift matrix obtained as a result of carrying out a cyclic shift operation on the Q×Q unit matrix or the Q×Q semi unit matrix, a Q×Q sum matrix obtained by carrying out a matrix addition operation on at least two of the Q×Q unit matrix, the Q×Q semi unit matrix and the Q×Q shift matrix and a Q×Q zero matrix or expressed by a second post-rearrangement matrix obtained by rearranging at least one row and one column in the second original parity check matrix as a matrix having the second structure where notation Q denotes an integer having a non-unity measure F common to the integers Q and P, wherein a process to decode received values each obtained as a result of receiving the LDPC code in the first or second format includes at least F check-node processes carried out concurrently as processes of F check nodes respectively or F variable-node processes carried out concurrently as processes of F variable nodes respectively.

The decoding apparatus described above includes:

message computation means for carrying out a process of decoding received values each obtained as a result of receiving the LDPC code by concurrently performing the F check-node processes or F variable-node processes and outputting F messages obtained as a result of the F check-node processes or the F variable-node processes;

shift means for carrying out F×F cyclic shift operations on the F messages generated by the message computation means and output F messages as a result of the F×F cyclic shift operations; and storage means for storing the F messages generated by the shift means and allowing the stored F messages to be read out or storing F received values cited above and allowing the stored F received values to be read out.

The decoding apparatus further includes control means for controlling an operation to supply a unit composed of the F received values corresponding to third configuration matrixes, which are included in a matrix having a third structure as third configuration matrixes derived from the first or second configuration matrixes, to the message computation means as an operation to supply the received values to the message computation means by carrying out at least a column rearrangement process or a process equivalent to the column rearrangement process on the received values expressed by the first parity check matrix having the first structure or the second parity check matrix having the second structure where the third structure is a structure obtained by combining a plurality of the third configuration matrixes including an F×F unit matrix, an F×F semi unit matrix obtained by setting the value of each of one or more matrix elements of the F×F unit matrix from 1 to 0, an F×F shift matrix obtained as a result of carrying out a cyclic shift operation on the F×F unit matrix or the F×F semi unit matrix, an F×F sum matrix obtained by carrying out a matrix addition operation on at least two of the F×F unit matrix, the F×F semi unit matrix and the F×F shift matrix and an F×F zero matrix.

A decoding method according to another embodiment of the present invention is a decoding method for the decoding apparatus and a program according to the other embodiment of the present invention is a program implementing the decoding method.

That is to say, in accordance with the other embodiment of the present invention, there is provided a decoding method to be adopted by a decoding apparatus for decoding an LDPC code received in:

a first format expressed by a first original parity check matrix having a first structure obtained by combining a plurality of first configuration matrixes including a P×P unit matrix, a P×P semi unit matrix obtained by setting the value of each of one or more matrix elements of the P×P unit matrix from 1 to 0, a P×P shift matrix obtained as a result of carrying out a cyclic shift operation on the P×P unit matrix or the P×P semi unit matrix, a P×P sum matrix obtained by carrying out a matrix addition operation on at least two of the P×P unit matrix, the P×P semi unit matrix and the P×P shift matrix and a P×P zero matrix or expressed by a first post-rearrangement matrix obtained by rearranging at least one row and one column in the first original parity check matrix as a matrix having the first structure where notation P denotes an integer; or a second format expressed by a second original parity check matrix having a second structure obtained by combining a plurality of second configuration matrixes including a Q×Q unit matrix, a Q×Q semi unit matrix obtained by setting the value of each of one or more matrix elements of the Q×Q unit matrix from 1 to 0, a Q×Q shift matrix obtained as a result of carrying out a cyclic shift operation on the Q×Q unit matrix or the Q×Q semi unit matrix, a Q×Q sum matrix obtained by carrying out a matrix addition operation on at least two of the Q×Q unit matrix, the Q×Q semi unit matrix and the Q×Q shift matrix and a Q×Q zero matrix or expressed by a second post-rearrangement matrix obtained by rearranging at least one row and one column in the second original parity check matrix as a matrix having the second structure where notation Q denotes an integer having a non-unity measure F common to the integers Q and P, whereby, in order to decode received values each obtained as a result of receiving the LDPC code in the first or second format, the decoding apparatus executes the step of concurrently carrying out F check-node processes as processes of F check nodes respectively or concurrently carrying out F variable-node processes as processes of F variable nodes respectively.

In addition, in accordance with the other embodiment of the present invention, there is provided a program to be executed by a computer for controlling a decoding apparatus for decoding an LDPC code received in:

a first format expressed by a first original parity check matrix having a first structure obtained by combining a plurality of first configuration matrixes including a P×P unit matrix, a P×P semi unit matrix obtained by setting the value of each of one or more matrix elements of the P×P unit matrix from 1 to 0, a P×P shift matrix obtained as a result of carrying out a cyclic shift operation on the P×P unit matrix or the P×P semi unit matrix, a P×P sum matrix obtained by carrying out a matrix addition operation on at least two of the P×P unit matrix, the P×P semi unit matrix and the P×P shift matrix and a P×P zero matrix or expressed by a first post-rearrangement matrix obtained by rearranging at least one row and one column in the first original parity check matrix as a matrix having the first structure where notation P denotes an integer; or a second format expressed by a second original parity check matrix having a second structure obtained by combining a plurality of second configuration matrixes including a Q×Q unit matrix, a Q×Q semi unit matrix obtained by setting the value of each of one or more matrix elements of the Q×Q unit matrix from 1 to 0, a Q×Q shift matrix obtained as a result of carrying out a cyclic shift operation on the Q×Q unit matrix or the Q×Q semi unit matrix, a Q×Q sum matrix obtained by carrying out a matrix addition operation on at least two of the Q×Q unit matrix, the Q×Q semi unit matrix and the Q×Q shift matrix and a Q×Q zero matrix or expressed by a second post-rearrangement matrix obtained by rearranging at least one row and one column in the second original parity check matrix as a matrix having the second structure where notation Q denotes an integer having a non-unity measure F common to the integers Q and P, wherein a process to decode received values each obtained as a result of receiving the LDPC code in the first or second format includes F check-node processes carried out concurrently as processes of F check nodes respectively or F variable-node processes carried out concurrently as processes of F variable nodes respectively.

In accordance with a further embodiment of the present invention, there is provided a data transmitting/receiving system wherein:

an LDPC code to be used as an error correction code has a format that can be expressed by an original parity check matrix having a structure obtained by combining a plurality of configuration matrixes including an $\alpha \times \alpha$ unit matrix, an $\alpha \times \alpha$ a semi unit matrix obtained by setting the value of each of one or more matrix elements of the $\alpha \times \alpha$ unit matrix from 1 to 0, an $\alpha \times \alpha$ a shift matrix obtained as a result of carrying out a cyclic shift operation on the $\alpha \times \alpha$ unit matrix or the $\alpha \times \alpha$ semi unit matrix, an $\alpha \times \alpha$ sum matrix obtained by carrying out a matrix addition operation on at least two of the $\alpha \times \alpha$ unit matrix, the $\alpha \times \alpha$ semi unit matrix and the $\alpha \times \alpha$ shift matrix and an $\alpha \times \alpha$ zero matrix or expressed by a post-rearrangement matrix obtained by rearranging at least one row and one column in the original parity check matrix as a matrix having the structure where notation $\alpha$ denotes any integer other than 1;

K integers are selected among a plurality of different integers each equal to a multiple of an integer F other than 1 where notation K denotes an integer at least equal to 2;

each of the selected K integers is used as the integer $\alpha$ to provide LDPC codes of K different types; and each of the LDPC codes of the K different types is used as an error correction code.

In the data transmitting/receiving system according to the further embodiment of the present invention, an LDPC code determined as described below is used as an error correction code. An LDPC (Low Density Parity Check) code to be used as an error correction code has a format that can be expressed by an original parity check matrix having a structure obtained by combining a plurality of configuration matrixes including an $\alpha \times \alpha$ unit matrix, an $\alpha \times \alpha$ semi unit matrix obtained by setting the value of each of one or more matrix elements of the $\alpha \times \alpha$ unit matrix from 1 to 0, an $\alpha \times \alpha$ shift matrix obtained as a result of carrying out a cyclic shift operation on the $\alpha \times \alpha$ unit matrix or the $\alpha \times \alpha$ semi unit matrix, an $\alpha \times \alpha$ sum matrix obtained by carrying out a matrix addition operation on at least two of the $\alpha \times \alpha$ unit matrix, the $\alpha \times \alpha$ a semi unit matrix and the $\alpha \times \alpha$ shift matrix and an $\alpha \times \alpha$ a zero matrix or expressed by a post-rearrangement matrix obtained by rearranging at least one row and one column in the original parity check matrix as a matrix having the structure where notation $\alpha$ denotes any integer other than 1. First of all, K integers are selected among a plurality of different integers each equal to a multiple of an integer F other than 1 where notation K denotes an integer at least equal to 2. Then, each of the selected K integers is used as the integer $\alpha$ to provide LDPC codes of K different types. Finally, each of the LDPC codes of the K different types is used as an error correction code.

In accordance with a still further embodiment of the present invention, there is provided a data receiving apparatus employed by a data transmitting/receiving system wherein:

an LDPC code to be used as an error correction code has a format that can be expressed by an original parity check matrix having a structure obtained by combining a plurality of configuration matrixes including an $\alpha \times \alpha$ unit matrix, an $\alpha \times \alpha$ semi unit matrix obtained by setting the value of each of one or more matrix elements of the $\alpha \times \alpha$ unit matrix from 1 to 0, an $\alpha \times \alpha$ shift matrix obtained as a result of carrying out a cyclic shift operation on the $\alpha \times \alpha$ unit matrix or the $\alpha \times \alpha$ semi unit matrix, an $\alpha \times \alpha$ sum matrix obtained by carrying out a matrix addition operation on at least two of the $\alpha \times \alpha$ unit matrix, the $\alpha \times \alpha$ semi unit matrix and the $\alpha \times \alpha$ shift matrix and an $\alpha \times \alpha$ zero matrix or expressed by a post-rearrangement matrix obtained by rearranging at least one row and one column in the original parity check matrix as a matrix having the structure where notation $\alpha$ denotes any integer other than 1;

K integers are selected among a plurality of different integers each equal to a multiple of an integer F other than 1 where notation K denotes an integer at least equal to 2;

each of the selected K integers is used as the integer $\alpha$ to provide LDPC codes of K different types; and each of the LDPC codes of the K different types is used as an error correction code.

The data receiving apparatus includes decoding means for performing processing to decode received values each obtained as a result of receiving the LDPC code of one of the K different types as an LDPC code, which has the format with the integer α set at one of the K integers, by carrying out at least F check-node processes concurrently as processes of F check nodes respectively or F variable-node processes concurrently as processes of F variable nodes respectively.

A data receiving method according to a still further embodiment of the present invention is a method provided for the data receiving apparatus described above.

That is to say, in accordance with the further embodiment of the present invention, there is provided a data receiving method to be adopted by a data receiving apparatus employed by a data transmitting/receiving system wherein:

an LDPC code to be used as an error correction code has a format that can be expressed by an original parity check matrix having a structure obtained by combining a plurality of configuration matrixes including an α×α unit matrix, an α×α semi unit matrix obtained by setting the value of each of one or more matrix elements of the α×α unit matrix from 1 to 0, an α×α shift matrix obtained as a result of carrying out a cyclic shift operation on the α×α unit matrix or the α×α semi unit matrix, an α×α sum matrix obtained by carrying out a matrix addition operation on at least two of the α×α unit matrix, the α×α semi unit matrix and the α×α shift matrix and an α×α zero matrix or expressed by a post-rearrangement matrix obtained by rearranging at least one row and one column in the original parity check matrix as a matrix having the structure where notation α denotes any integer other than 1;

K integers are selected among a plurality of different integers each equal to a multiple of an integer F other than 1 where notation K denotes an integer at least equal to 2;

each of the selected K integers is used as the integer α to provide LDPC codes of K different types; and each of the LDPC codes of the K different types is used as an error correction code, The data receiving method includes a step of performing processing to decode received values each obtained as a result of receiving the LDPC code of one of the K different types as an LDPC code, which has the format with the integer αset at one of the K integers, by carrying out at least F check-node processes concurrently as processes of F check nodes respectively or F variable-node processes concurrently as processes of F variable nodes respectively.

In accordance with the present invention, it is possible to provide a decoding apparatus for decoding an LDPC code, a data receiving apparatus employing the decoding apparatus as an apparatus configuration element and a data transmitting/ receiving system including the data receiving apparatus as a system configuration element. In particular, the decoding apparatus according to the embodiments of the present invention is capable of decoding a plurality of LDPC codes having structures different from each other. It is also possible to reduce the circuit size of the decoding apparatus according to the embodiments of the present invention and the circuit size of the whole data receiving apparatus.

BRIEF DESCRIPTION OF THE DRAWINGS

FIG. 1 is a diagram showing a typical sparse parity check matrix defining an LDPC code;

FIG. 2 is a diagram showing a typical parity check matrix including a lower triangular matrix as a parity check matrix defining an LDPC code;

FIG. 9 is a diagram showing a typical parity check matrix composed of configuration matrixes each having a 6×6 structure;

FIG. 13 which is a diagram showing a typical 6×6 shift matrix used as a configuration matrix of a parity check matrix;

FIG. 14 is an explanatory diagram to be referred to in description of the procedure of a process carried out to rearrange rows and columns in the 6×6 shift matrix shown in the diagram of FIG. 13 in order to generate 3×3 configuration matrixes;

FIG. 15 is a diagram showing a post-rearrangement matrix composed of configuration matrixes each having a 3×3 configuration as a post-rearrangement matrix obtained as a result of execution of the procedure shown in the explanatory diagram of FIG. 14 on the typical 6×6 parity check matrix shown in the diagram of FIG. 9;

FIG. 16 is an explanatory diagram to be referred to in description of the procedure of a process carried out to rearrange rows and columns in the 6×6 shift matrix shown in the diagram of FIG. 13 in order to generate 2×2 configuration matrixes; and FIG. 17 is a block diagram showing a typical configuration of a computer functioning as a decoding apparatus according to another embodiment of the present invention.

DETAILED DESCRIPTION OF THE PREFERRED EMBODIMENTS

Before preferred embodiments of the present invention are explained, relations between disclosed inventions and the embodiments are explained in the following comparative description. It is to be noted that, even if there is an embodiment described in this specification but not included in the following comparative description as an embodiment corresponding to an invention, such an embodiment is not to be interpreted as an embodiment not corresponding to an invention. Conversely speaking, an embodiment included in the following comparative description as an embodiment corresponding to a specific invention is not to be interpreted as an embodiment not corresponding to an invention other than the specific invention.

In addition, the following comparative description is not to be interpreted as a comprehensive description covering all inventions disclosed in this specification. In other words, the following comparative description by no means denies existence of inventions disclosed in this specification but not included in claims as inventions for which a patent application is filed. That is to say, the following comparative description by no means denies existence of inventions to be included in a separate application for a patent, included in an amendment to this specification or added in the future.

Figure 12:
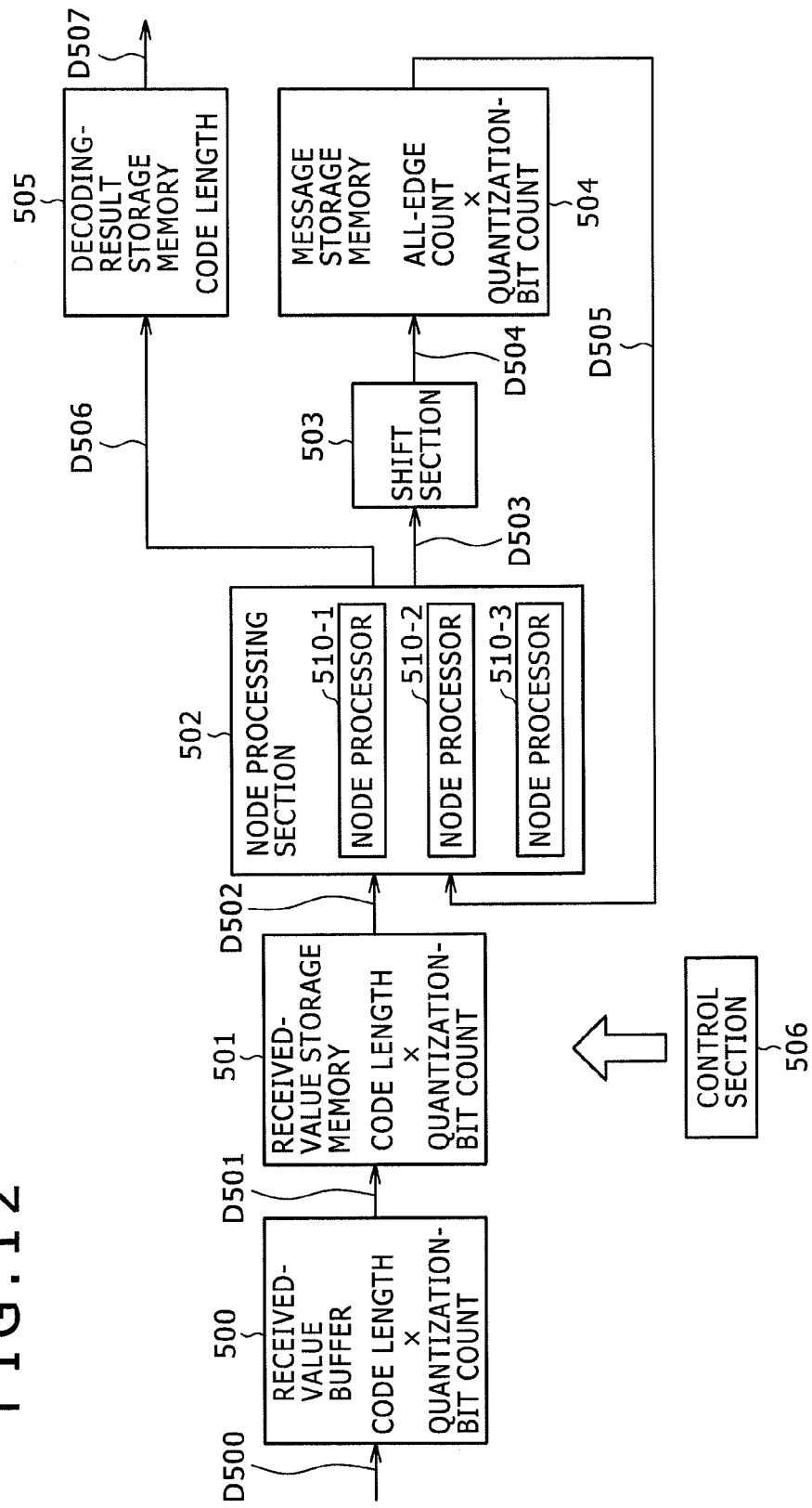
FIG. 12 is a block diagram showing a typical decoding apparatus provided by an embodiment of the present invention as an apparatus for decoding data coded by making use of an LDPC code described above as an LDPC code for P=6.

In accordance with an embodiment of the present invention, there is provided a decoding apparatus (such as a decoding apparatus shown in a diagram of FIG. 12) for decoding an LDPC (Low Density Parity Check) code received in:

a first format expressed by a first original parity check matrix having a first structure obtained by combining a plurality of first configuration matrixes including a P×P unit matrix, a P×P semi unit matrix obtained by setting the value of each of one or more matrix elements of the P×P unit matrix from 1 to 0, a P×P shift matrix obtained as a result of carrying out a cyclic shift operation on the P×P unit matrix or the P×P semi unit matrix, a P×P sum matrix obtained by carrying out a matrix addition operation on at least two of the P×P unit matrix, the P×P semi unit matrix and the P×P shift matrix and a P×P zero matrix or expressed by a first post-rearrangement matrix obtained by rearranging at least one row and one column in the first original parity check matrix as a matrix having the first structure where notation P denotes an integer; or a second format expressed by a second original parity check matrix having a second structure obtained by combining a plurality of second configuration matrixes including a Q×Q unit matrix, a Q×Q semi unit matrix obtained by setting the value of each of one or more matrix elements of the Q×Q unit matrix from 1 to 0, a Q×Q shift matrix obtained as a result of carrying out a cyclic shift operation on the Q×Q unit matrix or the Q×Q semi unit matrix, a Q×Q sum matrix obtained by carrying out a matrix addition operation on at least two of the Q×Q unit matrix, the Q×Q semi unit matrix and the Q×Q shift matrix and a Q×Q zero matrix or expressed by a second post-rearrangement matrix obtained by rearranging at least one row and one column in the second original parity check matrix as a matrix having the second structure where notation Q denotes an integer having a non-unity measure F common to the integers Q and P, wherein a process to decode received values each obtained as a result of receiving the LDPC code in the first or second format includes at least F check-node processes carried out concurrently as processes of F check nodes respectively or F variable-node processes carried out concurrently as processes of F variable nodes respectively (in the case of F=3 for example, the process to decode received values includes processes carried out by node processors 510-1 to 510-3 employed in the decoding apparatus shown in the diagram of FIG. 12).

The decoding apparatus described above includes:

message computation means (such as a node processing section 502 employed in the decoding apparatus shown in the diagram of FIG. 12) for carrying out a process of decoding received values each obtained as a result of receiving the LDPC code by concurrently performing the F check-node processes or F variable-node processes and outputting F messages obtained as a result of the F check-node processes or the F variable-node processes;

shift means (such as a shift section 503 employed in the decoding apparatus shown in the diagram of FIG. 12) for carrying out F×F cyclic shift operations on the F messages generated by the message computation means and outputting F messages as a result of the F×F cyclic shift operations; and storage means (such as a message storage memory 504 or a received-value storage memory 501 which are employed in the decoding apparatus shown in the diagram of FIG. 12) for storing the F messages generated by the shift means and allowing the stored F messages to be read out or storing F received values cited above and allowing the stored F received values to be read out.

The decoding apparatus further includes control means (such as a control section 506 employed in the decoding apparatus shown in the diagram of FIG. 12) for controlling an operation to supply a unit composed of the F received values corresponding to third configuration matrixes, which are included in a matrix having a third structure as third configuration matrixes derived from the first or second configuration matrixes, to the message computation means as an operation to supply the received values to the message computation means by carrying out at least a column rearrangement process or a process equivalent to the column rearrangement process on the received values expressed by the first parity check matrix having the first structure or the second parity check matrix having the second structure where the third structure is a structure obtained by combining a plurality of the third configuration matrixes including an F×F unit matrix, an F×F semi unit matrix obtained by setting the value of each of one or more matrix elements of the F×F unit matrix from 1 to 0, an F×F shift matrix obtained as a result of carrying out a cyclic shift operation on the F×F unit matrix or the F×F semi unit matrix, an F×F sum matrix obtained by carrying out a matrix addition operation on at least two of the F×F unit matrix, the F×F semi unit matrix and the F×F shift matrix and an F×F zero matrix.

Next, techniques of the present invention are explained as follows.

The technical term "P code" used in this patent specification is one of LDPC codes. The P code has the property of a QC (quasi cyclic) code.

The QC code is a code, a coded word of which is a series of bits obtained by operating a cyclic shift operation on any original coded word by N (where N is a natural number) cycles in order to produce another coded word different from the original codes word.

A parity check matrix defining a QC code can be expressed by making use of typically a cyclic matrix. The cyclic matrix is referred to as a shift matrix in this patent specification. The cyclic matrix also referred to as a shift matrix is defined as a matrix obtained by carrying out a cyclic shift operation on a specific column selected from all columns of another matrix. An example of the specific column is the first column.

As described earlier, a shift matrix included in a parity check matrix defining a P code is a matrix obtained by carrying out a cyclic shift operation on a P×P unit matrix or a semi unit matrix. To put it in detail, by carrying out a cyclic shift operation on a specific column of a P×P unit matrix or a P×P semi unit matrix sequentially one column after another, shift matrixes having types different from each other can be generated sequentially one matrix after another. As the cyclic shift operation carried out on P columns of a P×P unit matrix or a P×P semi unit matrix is completed, the original P×P unit matrix or the original P×P semi unit matrix is regenerated.

That is to say, the unit of the cyclic shift operation is P columns.

It is necessary to pay attention to the fact that, strictly speaking, a P×P semi unit matrix used for defining a P code and a P×P shift matrix of the semi unit matrix are not included in a matrix defining a QC code. That is to say, a semi unit matrix appears only at a location on the right-upper corner of a parity check matrix defining the DVB-S2 LDPC codes including the P code. Thus, from this point of view, strictly speaking, the DVB-S2 LDPC code is not the QC code. In a decoding apparatus for decoding a DVB-S2 LDPC code, however, simple exception processing is merely carrying out on this defective portion. Thus, there is no difference whatsoever between the architectures of the decoding apparatus for decoding a DVB-S2 LDPC code and a decoding apparatus for decoding a QC code. For the reasons described above, the P code is not said to be one of QC codes. Instead, the above description states that the P code is an LDPC code that has the property of a QC (quasi cyclic) code.

In other words, the parity check matrix composed of configuration matrixes each having a P×P structure is a matrix obtained by regularly laying out its configuration matrixes including a P×P unit matrix, a P×P semi unit matrix obtained by setting the value of each of one or more matrix elements of the P×P unit matrix from 1 to 0, a P×P shift matrix obtained as a result of carrying out a cyclic shift operation on the P×P unit matrix or the P×P semi unit matrix, a P×P sum matrix obtained by carrying out a matrix addition operation on at least two of the P×P unit matrix, the P×P semi unit matrix and the P×P shift matrix and a P×P zero matrix. Since the P code can be expressed as a parity check matrix having such a regular structure, the P code is said to be an LDPC code that has the property of a QC (quasi cyclic) code.

That is to say, the P code has a regularity characteristic meaning that the P code can be expressed by a parity check matrix having a structure configured by regularly arranging units which are P×P configuration matrixes such as the P×P unit matrix, the P×P semi unit matrix, the P×P shift matrix, the P×P sum matrix and the P×P zero matrix. If a decoding apparatus for decoding a P code is implemented by adopting the related-art technology to have a configuration identical with that of the typical decoding apparatus shown in the block diagram of FIG. 10, P node processors connected in parallel are required instead of only six node processors connected in parallel. In addition, the shift section needs to carry out P×P cyclical shift operations instead of only 6×6 cyclical shift operations. On top of that, each of the memories must allow P pieces of data to be written into and read out from at the same time instead of only six pieces of data.

In order to solve the problems described above, inventors of the present invention have innovated a technique. In accordance with this technique, a rearrangement process is carried out by rearranging rows and columns of a parity check matrix composed of configuration matrixes each having the P×P structure in order to generate a matrix having the F×F configuration matrixes thereof regularly laid out or a process equivalent to the arrangement process is carried out and, finally, a decoding process is carried out on data obtained as a result of the rearrangement process or the process equivalent to the arrangement process as the data according to the post-arrangement matrix having the F×F configuration matrixes. In this case, notation F denotes a measure of the integer P. In the following description, the rearrangement process and the process equivalent to the arrangement process are both referred to simply as the rearrangement process. The F×F configuration matrixes are classified into the same categories as the P×P configuration matrixes. That is to say, the F×F configuration matrixes are classified into categories which are an F×F unit matrix, an F×F semi unit matrix obtained by setting the value of each of one or more matrix elements of the F×F unit matrix from 1 to 0, an F×F shift matrix obtained as a result of carrying out a cyclic shift operation on the F×F unit matrix or the F×F semi unit matrix, an F×F sum matrix obtained by carrying out a matrix addition operation on at least two of the F×F unit matrix, the F×F semi unit matrix and the F×F shift matrix and an F×F zero matrix.

It is to be noted that the rearrangement process and the process equivalent to the arrangement process are both referred to simply as the rearrangement process because of the following reasons. Before the process to decode data (or the process to supply the data to a node processor), it is not mandatory to carry out the rearrangement process by actually rearranging rows and/or columns in the parity check matrix stored in a buffer as an original matrix composed of configuration matrixes each having the P×P structure in order to generate a post-arrangement matrix composed of configuration matrixes each having the F×F structure and again store the post-arrangement matrix in the buffer before supplying the post-arrangement matrix to the node processor by way of a memory provided at a stage immediately preceding the node processor. That is to say, in accordance with an equivalent technique provided for the process equivalent to the arrangement process, the equivalent process can also be carried out to store the data in the buffer as it is in the incoming shape conforming to the parity check matrix composed of configuration matrixes each having the P×P structure and, then, transfer the data from the buffer to the memory before rearranging the rows and/or the columns in the parity check matrix composed of configuration matrixes each having the P×P structure in the memory in order to generate the post-arrangement matrix composed of configuration matrixes each having the F×F structure before the operation to supply the data to a node processor. In other words, seen from the node processor, the rearrangement process and the equivalent process result in the same state in which rows and/or columns in the parity check matrix composed of configuration matrixes each having the P×P structure have been rearranged in order to generate the matrix composed of configuration matrixes each having the F×F structure. Such a state is adequate for the processing need of the node processor.

To put it differently, the technique provided by the present invention is a technique for carrying out a rearrangement process including a process to rearrange at least columns of received values stored in the buffer as values expressed by the parity check matrix composed of configuration matrixes each having the P×P structure or including a process equivalent to the process. Thus, the technique provided by the present invention can also be said to be a technique for implementing an operation to supply received values to the node processor in units each composed of F received values corresponding to the F×F configuration matrixes as control of the operation to supply received values to the node processor.

Thus, by adoption of the technique provided by the present invention, even in a process to decode a P code, P parallel processes to be carried out concurrently by P node processors can be reduced to F parallel processes that can be carried out concurrently only by F node processors. In addition, the shift section needs to carry out only F×F cyclic shift operations in place of P×P cyclic shift operations. On top of that, each memory needs to allow only F pieces of data to be written into and read out from at the same time instead of P pieces of data.

As described above, by adoption of the technique provided by the present invention, the circuit size of the whole decoding apparatus according to the embodiment of the present invention can be made much smaller than that of the related-art decoding apparatus. As will be described later in detail, however, there are some cases in which a plurality of measures of the integer P exist. In such cases, it is not necessary to take the smallest measure as the measure F. Instead, as the measure F, it is proper to select a measure optimum for the transmission rate and the operating frequency.

In addition, as will be described later in detail, there is a case in which a non-unity integer Q different from the integer P also has a measure F. That is to say, the measure F is a measure common to the integers P and Q. In this case, a decoding apparatus employing F parallel node processors in accordance with the technique provided by the present invention is not only capable of decoding a P code, but also capable of selectively decoding a P code or a Q code.

Next, a decoding apparatus according to an embodiment of the present invention is explained concretely as follows. Let the integer P be 6 (P=6) and the measure F of the integer P be 3 (F=3). In this case, by adoption of the technique provided by the present invention, it is possible to construct a decoding apparatus with a configuration like one shown in a block diagram of FIG. 12. That is to say, FIG. 12 is a block diagram showing a typical configuration of a decoding apparatus to which an embodiment of the present invention is applied.

The typical decoding apparatus shown in the block diagram of FIG. 12 has a configuration including a received-value buffer 500, a received-value storage memory 501, a node processing section 502, a shift section 503, a message storage memory 504, a decoding-result storage memory 505 and a control section 506.

Figure 3:
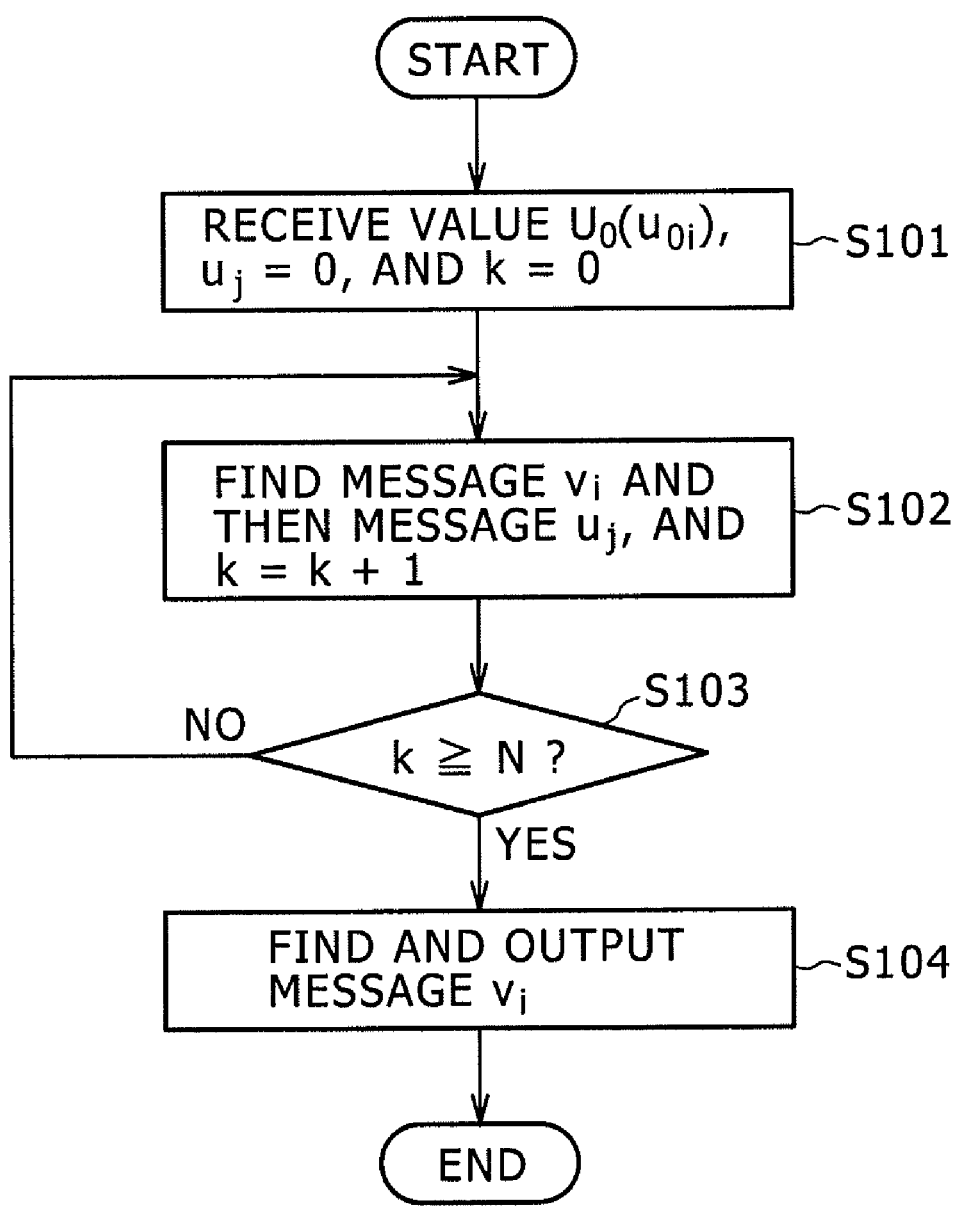
FIG. 3 shows an explanatory flowchart showing a series of processes carried out in order to decode an LDPC code.
Figures 4, 5:
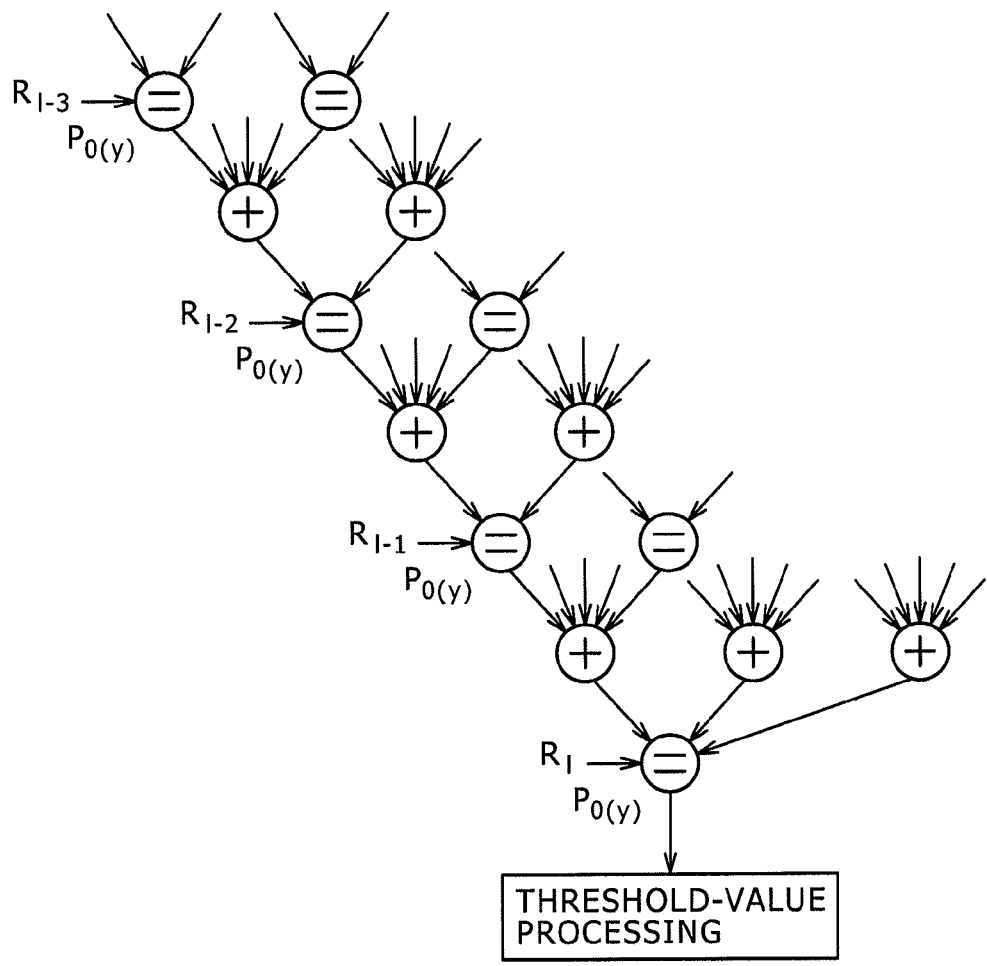
FIG. 4 is an explanatory diagram showing flows of messages.
FIG. 5 is a diagram showing a typical parity check matrix defining the LDPC code of a (3, 6) code.
Figure 6:
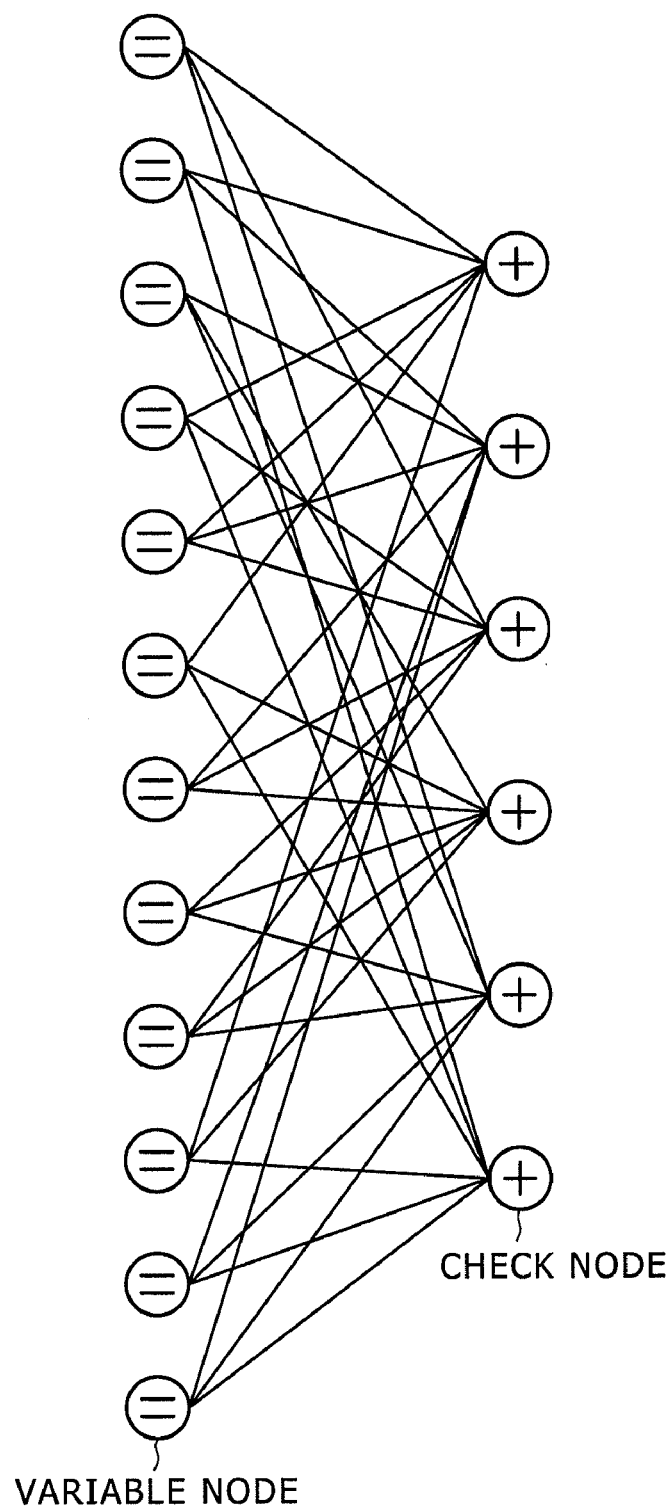
FIG. 6 is a diagram showing a Tanner graph representing the typical parity check matrix shown in the diagram of FIG. 5.
Figure 7:
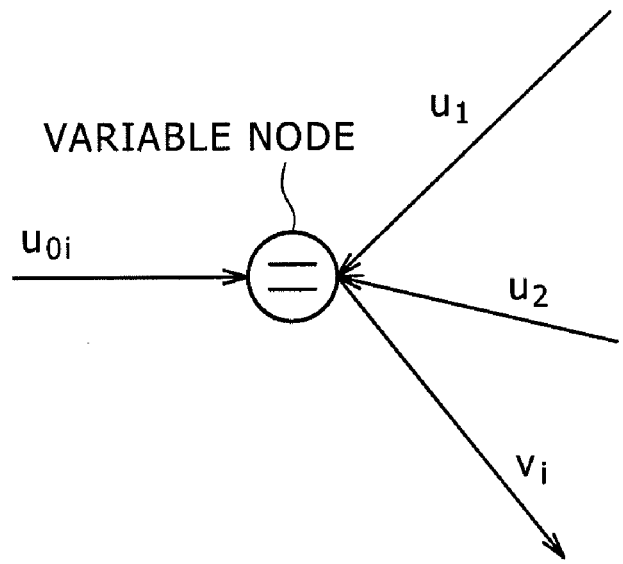
FIG. 7 is an explanatory diagram to be referred to in description of a process carried out at a variable node to compute a message.
Figure 8:
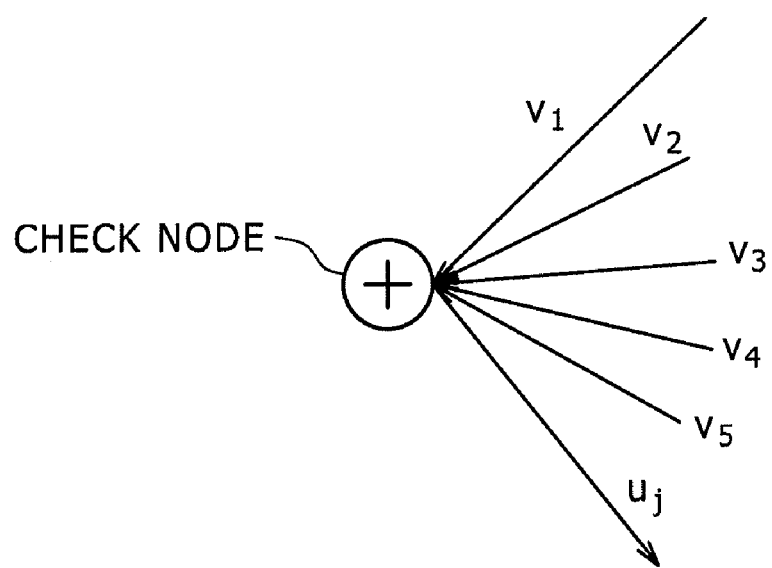
FIG. 8 is an explanatory diagram to be referred to in description of a process carried out at a check node to compute a message.
Figure 10:
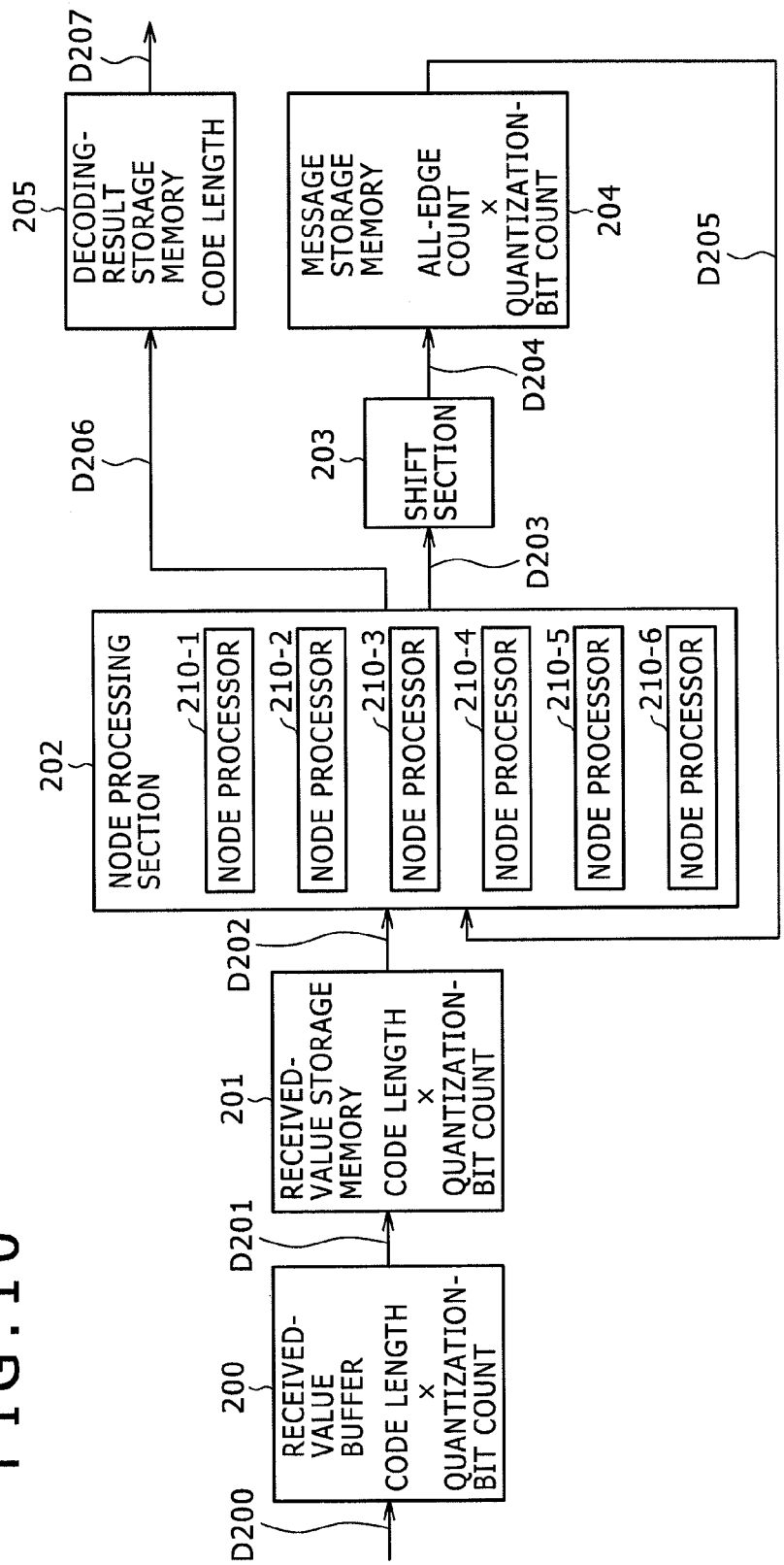
FIG. 10 is a block diagram showing a typical related-art decoding apparatus for decoding data coded by making use of an LDPC code described above as an LDPC code for P=6.

The overall configuration of the typical decoding apparatus shown in the block diagram of FIG. 12 is basically identical with that of the typical decoding apparatus shown in the block diagram of FIG. 10 except for the control section 506. That is to say, the interconnections of blocks each representing a functional configuration element and the role played by each individual one of the functional configuration elements as the function of the individual functional configuration element in the typical decoding apparatus shown in the block diagram of FIG. 12 are basically identical with those in the typical decoding apparatus shown in the block diagram of FIG. 10 except for the control section 506. When seen from the standpoint of each functional configuration element, however, the typical decoding apparatus shown in the block diagram of FIG. 12 and the typical decoding apparatus shown in the block diagram of FIG. 10 have the following differences.

Each of the received-value buffer 200, the received-value storage memory 201, the message storage memory 204 and the decoding-result storage memory 205, which are employed in the typical decoding apparatus shown in the block diagram of FIG. 10, has a configuration that allows six pieces of data (or 6 bits) for P=6 to be read out at the same time. On the other hand, each of the received-value buffer 500, the received-value storage memory 501, the message storage memory 504 and the decoding-result storage memory 505, which are employed in the typical decoding apparatus shown in the block diagram of FIG. 12, has a configuration that allows only three pieces of data (or 3 bits) for F=3 to be read out at the same time.

In addition, the shift section 203 employed in the typical decoding apparatus shown in the block diagram of FIG. 10 has a configuration that is capable of carrying out P×P cyclic shift operations where P=6. On the other hand, the shift section 503 employed in the typical decoding apparatus shown in the block diagram of FIG. 12 has a configuration capable of carrying out only F×F cyclic shift operations where F=3.

On top of that, the node processing section 202 employed in the typical decoding apparatus shown in the block diagram of FIG. 10 has 6 (=P) node processors 210-1 to 210-6. On the other hand, the node processing section 502 employed in the typical decoding apparatus shown in the block diagram of FIG. 12 has only 3 (=F) node processors 510-1 to 510-3.

Thus, since the typical decoding apparatus shown in the block diagram of FIG. 12 and the typical decoding apparatus shown in the block diagram of FIG. 10 have the differences seen from the standpoint of each functional configuration element as described above, in comparison with the typical decoding apparatus shown in the block diagram of FIG. 10, the typical entire decoding apparatus shown in the block diagram of FIG. 12 can be configured as an apparatus having a small circuit size.

Figure 11:
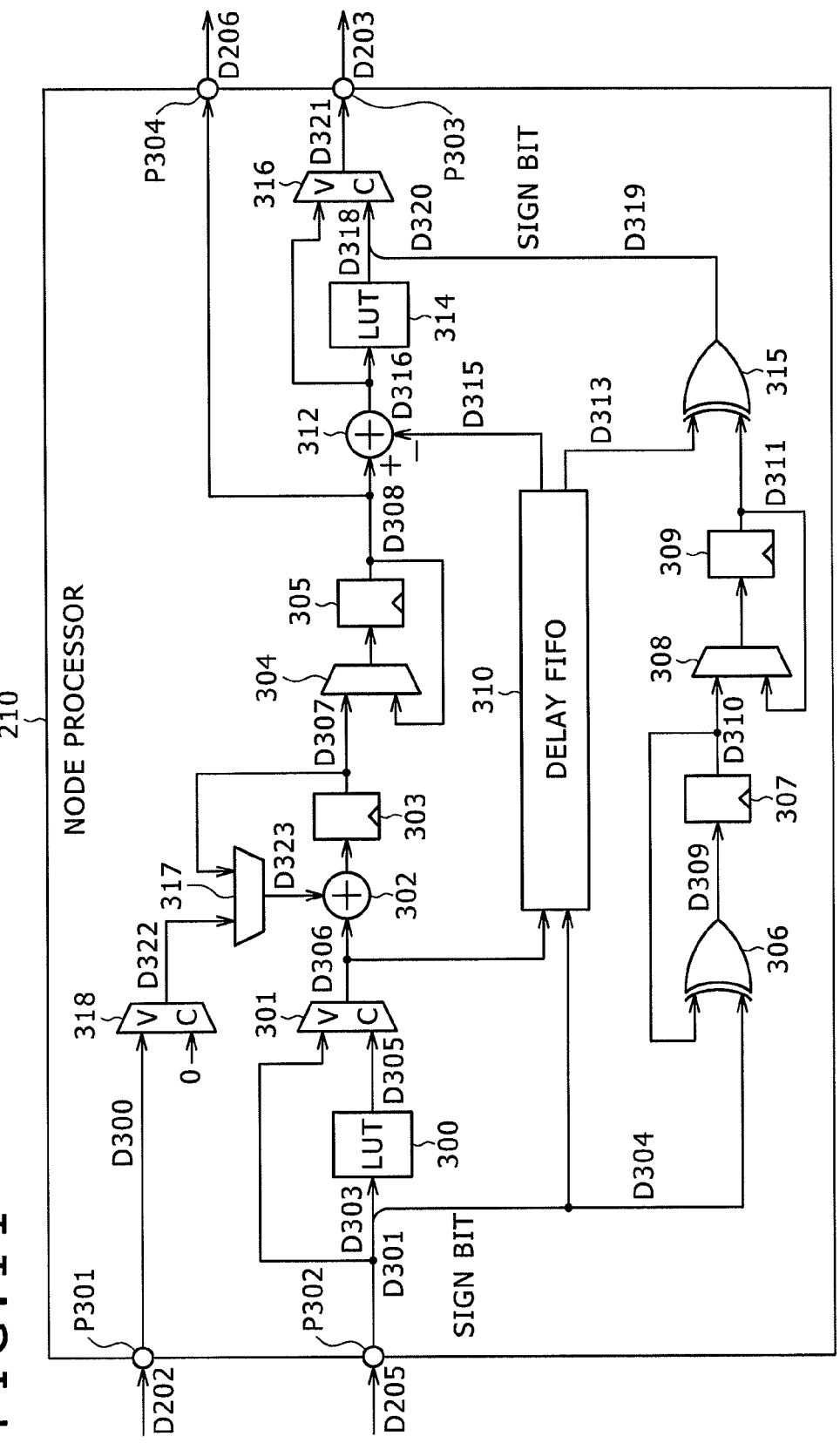
FIG. 11 is a block diagram showing a typical configuration of a node processors employed in a node processing section included in the decoding apparatus shown in the diagram of FIG. 10.

It is to be noted that the node processor 210 having the configuration shown in the block diagram of FIG. 11 can be used as it is as each of the node processors 510-1 to 510-3. Even if the node processors 510-1 to 510-3 themselves each have a configuration different from that shown in the block diagram of FIG. 11, it is needless to say that the present invention can be applied to the decoding apparatus shown in the block diagram of FIG. 12.

In addition, it is needless to say that the present invention can also be applied to a decoding apparatus with a configuration including three variable-node processors as circuits separated from the circuits of three check-node processors separately in place of the node processors 510-1 to 510-3 which are each used as both a variable-node processor and a check-node processor.

On top of that, it is also needless to say that the present invention can also be applied to a case in which the variable-node process is carried out without making use of the node processors 510-1 to 510-3.

Next, operations carried out by the typical decoding apparatus shown in the block diagram of FIG. 12 are explained.

It is to be noted that, as will be described later, the typical decoding apparatus like the one shown in the block diagram of FIG. 12 is capable of decoding a P code where P is any integer value having a measure F. In order to make the typical decoding apparatus shown in the block diagram of FIG. 12 easy to compare with the typical decoding apparatus shown in the block diagram of FIG. 10 in the following explanation of the operations carried out by the typical decoding apparatus shown in the block diagram of FIG. 12, however, the subject of decoding is assumed to be a P (=6) code defined by a parity check matrix composed of configuration matrixes each having the 6×6 structure as shown in the diagram of FIG. 9.

The received-value buffer 500 is a buffer used for storing data D500 received from a communication line as data having a size of 1 code before the data D500 is transferred to the received-value storage memory 501 as data D501.

A rearrangement process to rearrange columns of the parity check matrix corresponds to a process to rearrange code bits of a code-bit sequence. Thus, in accordance with control executed by the control section 506, the rearrangement process of the data D500 stored in the received-value buffer 500 is carried out as follows.

Figure 9:
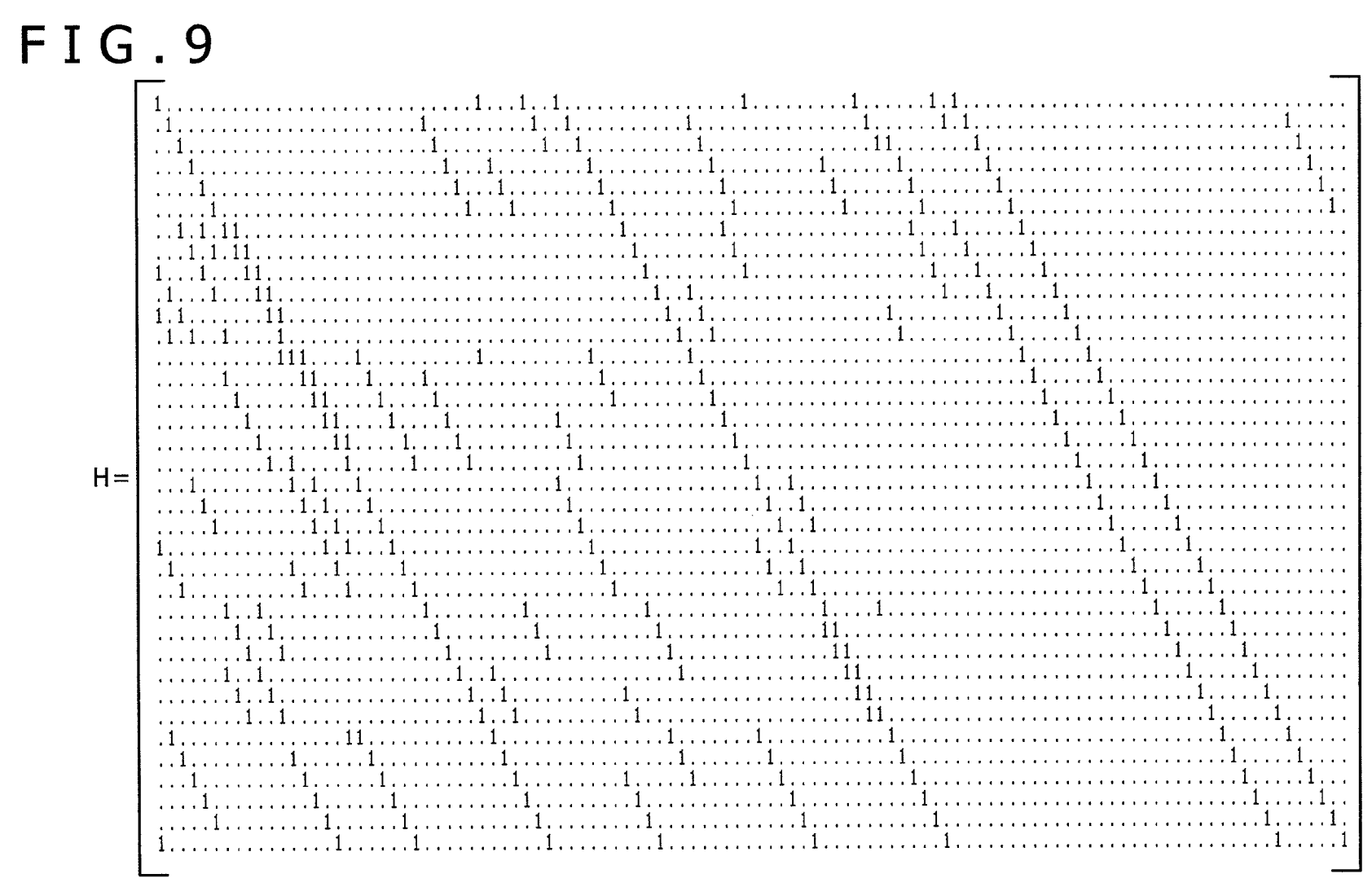

The parity check matrix shown in the diagram of FIG. 9 is treated as an aggregate of 6×6 configuration matrixes, each of which is taken as a rearrangement unit. Each of the 6×6 configuration matrixes is subjected to a rearrangement process to rearrange the 6×6 configuration matrix into a post-rearrangement matrix which is an aggregate of 3×3 configuration matrixes on the basis of a rule determined in advance as shown in diagrams of FIGS. 13 and 14. In accordance with the rule determined in advance, each of the 3×3 configuration matrixes shown in the diagram of FIG. 14 is a matrix composed of certain rows having row numbers providing the same remainder obtained as a result of dividing each of the row numbers by 2 and certain columns having column numbers providing the same remainder obtained as a result of dividing each of the column numbers by 2. Thus, a 3×3 configuration matrix is matrix composed of rows each having an even or odd row number and columns each having an even or column number as shown in the diagram of FIG. 14. In other words, the 6×6 configuration matrix shown in the diagram of FIG. 13 can be said to be compartmentalized into four such 3×3 configuration matrixes shown in the diagram of FIG. 14.

To put it concretely, the reader is requested to refer to FIG. 13 which is a diagram showing a typical 6×6 shift matrix of the parity check matrix composed of configuration matrixes each having a 6×6 structure as shown in the diagram of FIG. 9. In the diagram of FIG. 13, each number enclosed in a circle (○) is a column number whereas each number enclosed in a rectangle (□) is a row number.

As an example, the 6×6 shift matrix shown in the diagram of FIG. 13 is subjected to the rearrangement process according to the rule described above in order to convert the 6×6 shift matrix into a post-rearrangement matrix composed of four 3×3 configuration matrixes as shown in the diagram of FIG. 14. It is obvious that the post-rearrangement matrix shown in the diagram of FIG. 14 is compartmentalized by making use of dashed lines into four 3×3 configuration matrixes which are two 3×3 zero matrixes, one 3×3 semi unit matrix and one 3×3 shift matrix as shown in the diagram of FIG. 14.

Figure 15:
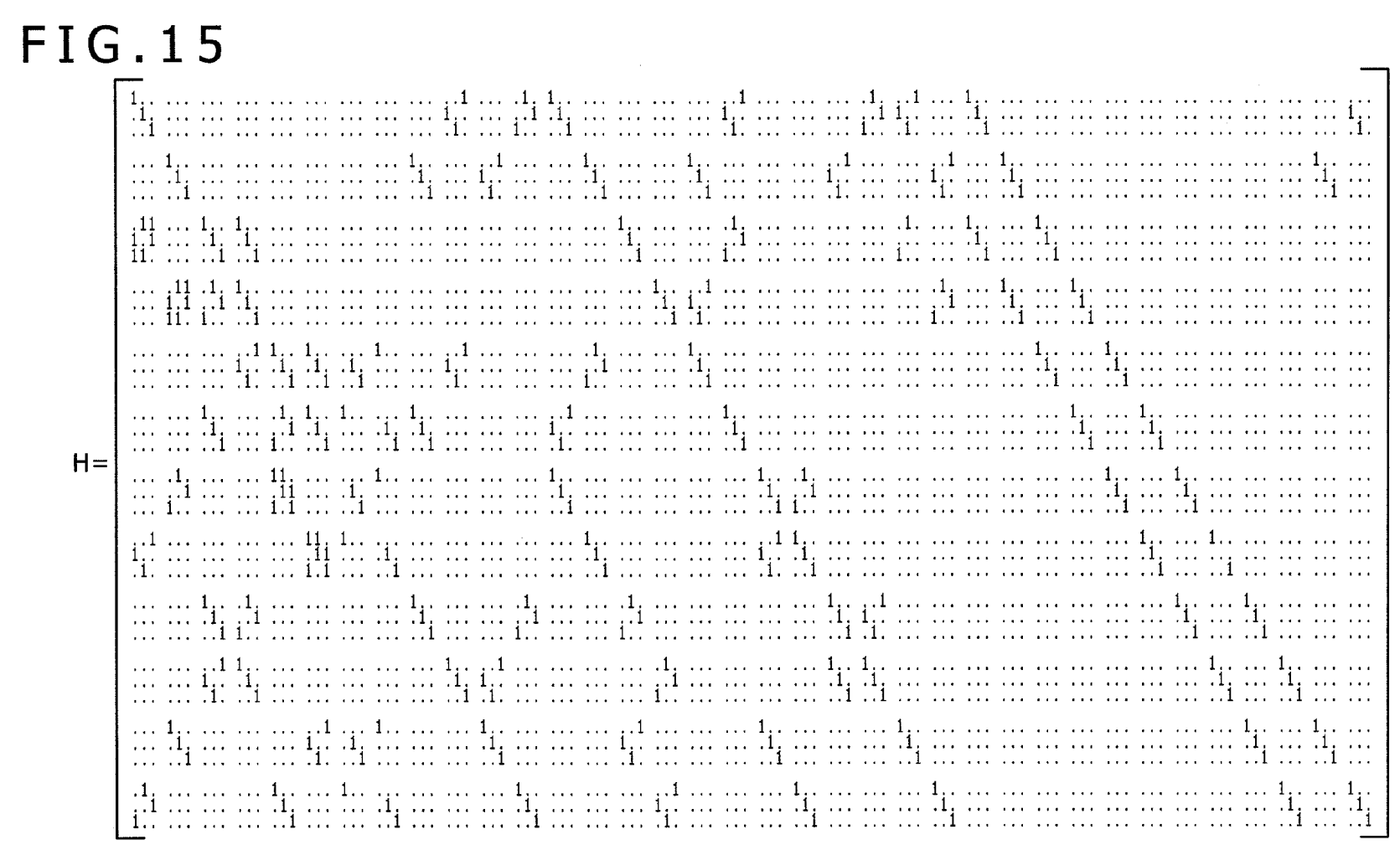

Each of other 6×6 configuration matrixes composing the parity check matrix composed of the configuration matrixes each having a 6×6 structure as shown in the diagram of FIG. 9 is subjected to the rearrangement process described above. As a result, the parity check matrix composed of configuration matrixes each having a 6×6 structure as shown in the diagram of FIG. 9 is rearranged into a post-rearrangement matrix having a structure shown in a diagram of FIG. 15. It is to be noted that, in order to make each of the configuration matrixes obtained as a result of the process to rearrange the parity check matrix composed of configuration matrixes each having a 6×6 structure as shown in the diagram of FIG. 9 as configuration matrixes each having a 3×3 structure easy to recognize, gaps are provided between the 3×3 configuration matrixes in the parity check matrix shown in the diagram of FIG. 15. The typical post-arrangement matrix shown in the diagram of FIG. 15 includes 3×3 unit matrixes, 3×3 semi unit matrixes, 3×3 shift matrixes, 3×3 sum matrixes and 3×3 zero matrixes.

Thus, except for the fact that operations carried out at stages following the received-value storage memory 201 employed in the typical decoding apparatus shown in the block diagram of FIG. 10 are operations for P=6 while operations carried out at stages following the received-value storage memory 501 employed in the typical decoding apparatus shown in the block diagram of FIG. 12 are operations for F=3, the operations carried out at stages following the received-value storage memory 501 employed in the typical decoding apparatus shown in the block diagram of FIG. 12 are similar to the operations carried out at stages following the received-value storage memory 201 employed in the typical decoding apparatus shown in the block diagram of FIG. 10. In other words, the operations carried out at stages following the received-value storage memory 501 employed in the typical decoding apparatus shown in the block diagram of FIG. 12 are entirely identical with operations carried out as if the decoding apparatus shown in the block diagram of FIG. 12 were an apparatus for decoding a P code where P=3.

If a method for rearranging received code bits before outputting the rearranged code bits to the received-value buffer 500 employed in the decoding apparatus shown in the block diagram of FIG. 12 through a communication line has been implemented as the transmission method in the first place, the code bits are rearranged in the received-value buffer 500 in an inverse manner concurrently with the rearrangement process described above. Instead of rearranging the code bits in an inverse manner concurrently with the rearrangement process described above, the code bits can be rearranged in the received-value buffer 500 before or after the rearrangement process.

In the above description, a measure F of 3 (F=3) is taken as a measure of the integer P of 6 (P=6). Of course, another measure F (that is, the measure F of 2) of the integer P (=6) can also be taken except the measure F of 1 because the measure must be a non-unity measure as described above. In this case, however, the rearrangement process is carried out on the parity check matrix composed of configuration matrixes each having the 6×6 structure as shown in the diagram of FIG. 9 in accordance with a rule determined in advance as described as follows. Each of the 6×6 configuration matrixes is subjected to a rearrangement process to rearrange the 6×6 configuration matrix into a post-rearrangement matrix shown in a diagram of FIG. 16. As shown in the diagram of FIG. 16, the post-rearrangement matrix is an aggregate of 2×2 configuration matrixes which are each a matrix composed of certain rows having row numbers providing the same remainder obtained as a result of dividing each of the row numbers by 3 and certain columns having column numbers providing the same remainder obtained as a result of dividing each of the column numbers by 3.

To put it concretely, as an example, the 6×6 shift matrix shown in the diagram of FIG. 13 is subjected to the rearrangement process according to the rule described above in order to convert the 6×6 shift matrix into a post-rearrangement matrix composed of nine 2×2 configuration matrixes as shown in the diagram of FIG. 16. It is obvious that the post-rearrangement matrix shown in the diagram of FIG. 16 is compartmentalized by making use of dashed lines into nine 2×2 configuration matrixes which are 2×2 zero matrixes, 2×2 semi unit matrixes and 2×2 shift matrixes.

Thus, also in the case of the measure F of 2, except for the fact that operations carried out at stages following the received-value storage memory 201 employed in the typical decoding apparatus shown in the block diagram of FIG. 10 are operations for P=6 while operations carried out at stages following the received-value storage memory 501 employed in the typical decoding apparatus shown in the block diagram of FIG. 12 are operations for F=2, the operations carried out at stages following the received-value storage memory 501 employed in the typical decoding apparatus shown in the block diagram of FIG. 12 are similar to the operations carried out at stages following the received-value storage memory 201 employed in the typical decoding apparatus shown in the block diagram of FIG. 10. In other words, the operations carried out at stages following the received-value storage memory 501 employed in the typical decoding apparatus shown in the block diagram of FIG. 12 are entirely identical with operations carried out as if the decoding apparatus shown in the block diagram of FIG. 12 were an apparatus for decoding a LDPC code for P=2.

That is to say, for F=2, the decoding apparatus does not have to adopt the configuration shown in the block diagram of FIG. 12. In other words, it is adequate to take a configuration including two parallel node processors, a shift section for carrying out 2×2 cyclic shift operations and memories each allowing two pieces of data (or 2 bits) to be written or read out at the same time.

In addition, the embodiment described so far is an embodiment for P=6. Naturally, however, the present invention can also be applied to cases of integers P other than 6. For example, the present invention can be applied to a parity check matrix composed of configuration matrixes each having a P×P structure where P=360. In this way, the technique according to the present invention can be adopted for a case of any P value. In addition, in accordance with the technique provided by the present invention, after the value of the integer P is determined, any measure F other than the numeral one can be taken.

That is to say, after the value of the integer P and a nonunity measure F of the integer P have been determined, a rearrangement process according to a rule described below is carried out on the parity check matrix composed of configuration matrixes each having a P×P structure as a parity check matrix defining a P code pertaining to the LDPC code in order to construct a configuration including F parallel node processors, a shift section for carrying out F×F cyclic shift operations and memories each allowing F pieces of data (or F bits) to be written or read out at the same time.

In accordance with the aforementioned rule, to put it generally, each of the configuration matrixes each having a P×P structure is compartmentalized into F×F configuration matrixes each composed of rows each having a row number providing the same remainder obtained as a result of dividing the row number by J (=P/F) derived from the equation P=F×J and columns each having a column number providing the same remainder obtained as a result of dividing the column number by J where the row number is a number included in the range 0 to (P−1) as a number to be assigned to each of P rows included in each of the P×P configuration matrixes composing the parity check matrix and the column number is a number included in the range 0 to (P−1) as a number to be assigned to each of P columns included in each of the P×P configuration matrixes composing the parity check matrix.

It is to be noted that, as described previously, the rearrangement process is not limited to the process to rearrange the parity check matrix stored in a buffer as a matrix composed of configuration matrixes each having a P×P structure in order to generate a post-arrangement matrix composed of configuration matrixes each having a F×F structure and again store the post-arrangement matrix in the buffer before supplying post-arrangement matrix to a node processor by way of a memory. That is to say, in the case of the embodiment described above, the rearrangement process is carried out to rearrange the parity check matrix stored in the received-value buffer 500 as a matrix composed of configuration matrixes each having a P×P structure in order to generate a post-arrangement matrix composed of configuration matrixes each having a F×F structure and again store the post-arrangement matrix in the received-value buffer 500 before supplying post-arrangement matrix to the node processing section 502 by way of the received-value storage memory 501. In accordance with an equivalent technique provided for a process equivalent to the arrangement process, however, the equivalent process can also be carried out to store the data in the received-value buffer 500 as it is in the incoming shape conforming to the parity check matrix composed of configuration matrixes each having the P×P structure and, then, rearrange the rows and/or the columns in the parity check matrix composed of configuration matrixes each having the P×P structure in the received-value storage memory 501 in accordance with the predetermined rule described above in order to generate the post-arrangement matrix composed of configuration matrixes each having the F×F structure before the operation to supply the data to the node processing section 502. That is to say, data is selectively read out from the received-value storage memory 501 in accordance with the rule determined in advance and supplied to the node processing section 502. In other words, the rearrangement process is a process of a broad concept including the equivalent process according to the equivalent technique. It is to be noted that, by designating a control section as a section for controlling the operation to read out data from the received-value storage memory 501 in accordance with the predetermined rule described above, the control can be executed with ease. In the case of the decoding apparatus shown in the block diagram of FIG. 12, the control section 506 serves as this control section.

In addition, the embodiment described above is an embodiment provided for an encoding ratio of 2/3 and a code length of 108 which are of course no more than typical values. That is to say, for P=6 and the same or smaller total number of edges for example, even an arbitrary code length and an arbitrary encoding ratio are taken, the same decoding apparatus can be used for decoding the data by merely changing control signals. On top of that, a decoding apparatus designed as an apparatus for decoding data satisfying a condition of making use of the same P value, a code length not exceeding a value determined in advance and a total edge count not greater than an integer determined in advance is also capable of decoding data having a code length satisfying the condition but a different encoding ratio, What is described so far is summarized as follows. By applying the present invention, a value of the measure F representing the degree of parallelism in a decoding process can be selected arbitrarily from those in a range of measures of the integer P in accordance with the transmission rate and the operating frequency without any constraints imposed by the value of the integer P itself.

As a result, the circuit size of the decoding apparatus can be made smaller.

As an example, for P=360, its measure F can be arbitrarily selected from a range including the values of 360, 180 and 120. As also obvious from the fact that the measure F is the number of parallel node processors as described above, adoption of the present invention also means that the value of the measure F can be said as a value representing the degree of parallelism in a decoding process. For this reason, the designer of the decoding apparatus is allowed to select a measure F optimum for the transmission rate and the operating frequency while taking the degree of parallelism in the decoding process into consideration.

That is to say, if a large measure F of the integer P is selected for a required transmission rate, the degree of parallelism in the decoding process may become higher than a value actually required. Thus, data arrives only at intervals longer than the length of the time required for carrying out the decoding process since the time required for carrying out the decoding process is short due to the high degree of parallelism in the decoding process. For this reason, an optimum measure F is therefore selected from the range of measures of the integer P so that each of the intervals is about equal to the length of the time required for carrying out the decoding process. In this case, the measure F is decreased so that the degree of parallelism in the decoding process is also reduced as well. As a result, the circuit size of the decoding apparatus can be made smaller. In addition, if the circuit of the decoding apparatus operates at a higher speed in the future, an even smaller measure F can be selected to provide a low degree of parallelism in the decoding process. Even in this case, it is possible to achieve the same performance as that of the contemporary decoding apparatus.

In addition, if the integer P and an integer Q smaller than the integer P (P>Q) have a common measure, a decoding apparatus taking the common measure as the measure F representing the degree of parallelism in the decoding process is capable of decoding both the P and Q codes.

Thus, even if codes with a large P is selected for a service requiring a high transmission rate while codes with a small Q are selected for a service of portable receivers which does not require a high transmission rate, the same decoding apparatus can be used to implement a receiver apparatus provided with a decoding function capable of decoding the code of the service requiring a high transmission rate and the code of the service for portable receivers as a receiver apparatus common to the two services.

That is to say, the realization of a common receiver apparatus allows both the P code and the Q code to coexist in the transmission system.

If the DVB-S.2 LDPC code is transmitted at 8 PSK (Phase Shift Keying) and 30 Msym/s for example, the bit rate of the code bits is 90 Mbps. Since the average of column weights in a parity check matrix is about 3.5, on the assumption that the decoding process is repeated 50 times, the amount of processing required for each code bit is approximately 3.5×50×2=350. Thus, a clock frequency needs to be set at a product obtained as a result of multiplying the amount of processing by a value of 1.5 reflecting the efficiency of the circuit. Thus, the decoding apparatus needs to operate at an operating frequency of 131.25 MHz (=90 Mbps×350×1.5/360) where the value of 90 Mbps is the bit rate of the code bits, the value of 350 is the amount of processing required for each code, the value of 1.5 reflecting the efficiency of the circuit and the value of 360 represents the degree of parallelism of the decoding process.

In this case, the related-art decoding apparatus for P=360 representing the degree of parallelism of the decoding process requires a number of RAMs as a memory allowing 360 pieces of data to be written and read out at the same time. Such RAMs contribute to a poor area efficiency because of a small word count representing the storage capacity of each of the RAMs which are required to store a large bit count of the data. In addition, the related-art decoding apparatus also requires 360 parallel node processors. As a result, the circuit size of the related-art decoding apparatus is extremely large.

Thus, on the assumption that a DVB-S.2 LDPC code is applied to a transmission system having a transmission rate lower than 90 Mbps, even if the measure F representing the degree of parallelism of the decoding process is set at 60 (F=60), it is possible to realize the same operating frequency and the same number of times the decoding process is to be repeated and, hence, possible to achieve the same decoding performance. An example of the transmission rate lower than 90 Mbps is a transmission rate of 15 Mbps.

If the measure F representing the degree of parallelism of the decoding process is set at 60 (F=60), a memory allowing only 60 pieces of data to be written and read out at the same time is sufficient. Thus, when configuring the memory, since the number of bits of the stored data is smaller, it is possible to take the same total number of new RAMs each having a word count six times that of the RAM used in the past. In comparison with a RAM used in the past as the RAM contributing to a poor area efficiency as described above, each of the new RAMs should have a small physical size considerably improving the area efficiency. As an alternative, fewer new RAMs each having the same word count as that of the RAM used in the past can be used. In either case, the efficiency of an area used for storing the same number of bits is substantially improved as well. In addition, since the number of required parallel node processors is only 60, the circuit size of the related-art decoding apparatus can be further reduced.

That is to say, if a DVB-S.2 LDPC code is utilized in broadcasting of ground waves for example, it is difficult to receive the ground waves by making use of a portable mobile receiver due to a power consumption problem. In order to resolve this difficulty, it is possible to assume a case in which services are rendered by making use of a code having a code length smaller than a code for Q=60 as services oriented for portable mobile receivers. Even for such a case, by applying the present invention to the case, it is possible to easily implement a decoding apparatus with the measure F set at 60 (F=60) as a value representing the degree of parallelism of the decoding process. The decoding apparatus is capable of decoding codes up to a code with a code length of 64,800 and also capable of decoding both the P (=360) code and the Q (=60) code. Thus, a receiver employing such a decoding apparatus is capable of receiving services rendered for stationary receivers and services rendered for portable receivers. The services rendered for stationary receivers are services making use of the P (=360) code whereas the services rendered for portable receivers are services making use of the Q (=60) code.

What is described so far is summarized as follows. By applying the present invention, it is possible to implement a decoding apparatus for decoding an LDPC code having a large P value on the basis of a measure F of the integer P. That is to say, it is possible to implement a decoding apparatus for a transmission system having a low bit rate and a future system employing a circuit with an increased processing speed. In comparison with the related-art decoding apparatus, the decoding apparatus according to the embodiment of the present invention has a small circuit size.

In addition, by applying the present invention, a code based on the integer P having a plurality of measures F can be decoded by a decoding apparatus designed on the basis of all the measures F. Thus, LDPC codes having sizes properly adjusted in accordance with different transmission rates and different services rendered for different service recipients are allowed to coexist in one transmission system.

That is to say, even though only the P code and the Q code of two different types are used in the typical transmission system described above, in general, a codes (such as P and Q codes) of K different types can be used where notation α denotes the type of a used code and notation K denotes the number of different types of the used codes. The number of different types is equal to or greater than 2 (K≧2). Notation K also denotes the number of integers selected by the system designer or the like from a plurality of different integers which are each a multiple of the non-unity measure F. That is to say, the number of different α codes that can be used is also K.

By the way, the series of processes described previously can be carried out by hardware and/or execution of software.

If the series of processes described above is carried out by execution of software, programs composing the software are executed by a computer implementing the decoding apparatus according to the embodiment of the present invention. The computer has a configuration like one shown in a block diagram of FIG. 17.

In the decoding apparatus shown in the block diagram of FIG. 17, a CPU (Central Processing Unit) 1001 carries out various kinds of processing by execution of programs stored in a ROM (Read Only Memory) 1002 or programs loaded from a storage block 1008 into a RAM (Random Access Memory) 1003. The RAM 1003 is also used for properly storing various kinds of information such as data required in execution of the processing.

The CPU 1001, the ROM 1002 and the RAM 1003 are connected to each other by a bus 1004, which is also connected to an input/output interface 1005.

The input/output interface 1005 is connected to an input block 1006, an output block 1007, the storage block 1008 cited above and a communication block 1009. The input block 1006 includes a keyboard and a mouse whereas the output block 1007 includes a display unit. The storage block 1008 includes a hard disk. The communication block 1009 has a modem or a terminal adaptor. The communication block 1009 is a unit for carrying out communication processing with other apparatus through a network (such as the Internet) not shown in the block diagram of the figure.

The input/output interface 1005 is also connected to a drive 1010 as needed on which a recording medium is mounted. The recording medium is a removable medium 1111 which can be a magnetic disk, an optical disk, a magneto-optical disk or a semiconductor memory. As described above, a computer program to be executed by the CPU 1001 is installed from the removable medium 1111 into the storage block 1008.

As explained earlier, the series of processes described previously can be carried out by hardware and/or execution of software. If the series of processes described above is carried out by execution of software, programs composing the software can be installed into a computer embedded in dedicated hardware, a general-purpose personal computer or the like from typically a network or the removable medium 1111. In this case, the computer or the personal computer is the computer described above as a computer which serves as the decoding apparatus. A general-purpose personal computer is a personal computer, which can be made capable of carrying out a variety of functions by installing a variety of programs into the personal computer.

The aforementioned removable medium 1111 for recording programs to be installed into the computer or the general-purpose personal computer as programs to be executed by the computer or the general-purpose personal computer respectively is a removable recording medium provided to the user separately from the main unit of the decoding apparatus as shown in the diagram of FIG. 17. Examples of the removable recording media also each referred to as a package medium include the magnetic disk such as a flexible disk, the optical disk such as a CD-ROM (Compact Disk-Read Only Memory) or a DVD (Digital Versatile Disk), the magneto-optical disk such as an MD (Mini Disk) as well as the semiconductor memory. Instead of installing the programs from the removable recording media, the programs can also be stored in advance in an embedded recording medium included in the main unit of the decoding apparatus. Examples of the embedded recording medium are a hard disk included in the storage block 1008 and the ROM 1002.

It is also worth noting that, in this patent specification, steps of the flowchart described above can be carried out not only in a pre-prescribed order along the time axis, but also concurrently or individually.

In addition, it should be understood by those skilled in the art that a variety of modifications, combinations, sub-combinations and alterations may occur, depending on design requirements and other factors as far as they are within the scope of the appended claims or the equivalents thereof.

It is also to be noted that the technical term "system" used in this specification implies the configuration of a confluence including a plurality of apparatus.

What is claimed is:

1. A decoding apparatus for decoding an LDPC (Low Density Parity Check) code received in:
   a first format expressed by a first original parity check matrix having a first structure obtained by combining a plurality of first configuration matrixes including a P×P unit matrix, a P×P semi unit matrix obtained by setting the value of each of one or more matrix elements of said P×P unit matrix from 1 to 0, a P×P shift matrix obtained as a result of carrying out a cyclic shift operation on said P×P unit matrix or said P×P semi unit matrix, a P×P sum matrix obtained by carrying out a matrix addition operation on at least two of said P×P unit matrix, said P×P semi unit matrix and said P×P shift matrix and a P×P zero matrix or expressed by a first post-rearrangement matrix obtained by rearranging at least one row and one column in said first original parity check matrix as a matrix having said first structure where notation P denotes an integer; or
   a second format expressed by a second original parity check matrix having a second structure obtained by combining a plurality of second configuration matrixes including a Q×Q unit matrix, a Q×Q semi unit matrix obtained by setting the value of each of one or more matrix elements of said Q×Q unit matrix from 1 to 0, a Q×Q shift matrix obtained as a result of carrying out a cyclic shift operation on said Q×Q unit matrix or said Q×Q semi unit matrix, a Q×Q sum matrix obtained by carrying out a matrix addition operation on at least two of said Q×Q unit matrix, said Q×Q semi unit matrix and said Q×Q shift matrix and a Q×Q zero matrix or expressed by a second post-rearrangement matrix obtained by rearranging at least one row and one column in said second original parity check matrix as a matrix having said second structure where notation Q denotes an integer having a non-unity measure F common to said integers Q and P,
   said apparatus including a computer programmed to decode received values each obtained as a result of receiving said LDPC code in said first or second format, said computer being programmed to perform at least F check-node processes carried out concurrently as processes of F check nodes respectively or F variable-node processes carried out concurrently as processes of F variable nodes respectively.

2. The decoding apparatus according to claim 1, wherein said computer is programmed to perform:
   as a message computation means for carrying out a process of decoding received values each obtained as a result of receiving said LDPC code by concurrently performing said F check-node processes or F variable-node processes and outputting F messages obtained as a result of said F check-node processes or said F variable-node processes; and
   as a shift means for carrying out F×F cyclic shift operations on said F messages generated by said message computation means and outputting F messages as a result of said F×F cyclic shift operations; and said decoding apparatus includes
   a store for storing said outputted F messages generated by said shift means and allowing said stored F messages to be read out or for storing F received values and allowing said stored F received values to be read out.

3. The decoding apparatus according to claim 2, wherein said computer is further programmed to control
   an operation to supply a unit composed of said F received values corresponding to third configuration matrixes, which are included in a matrix having a third structure as third configuration matrixes derived from said first or second configuration matrixes, to said message computation means as an operation to supply said received values to said message computation means by carrying out at least a column rearrangement process or a process equivalent to said column rearrangement process on said received values expressed by said first parity check matrix having said first structure or said second parity check matrix having said second structure where said third structure is a structure obtained by combining a plurality of said third configuration matrixes including an F×F unit matrix, an F×F semi unit matrix obtained by setting said value of each of one or more matrix elements of said F×F unit matrix from 1 to 0, an F×F shift matrix obtained as a result of carrying out a cyclic shift operation on said F×F unit matrix or said F×F semi unit matrix, an F×F sum matrix obtained by carrying out a matrix addition operation on at least two of said F×F unit matrix, said F×F semi unit matrix and said F×F shift matrix and an F×F zero matrix.

4. A decoding method to be adopted by a decoding apparatus for decoding an LDPC (Low Density Parity Check) code received in:
a first format expressed by a first original parity check matrix having a first structure obtained by combining a plurality of first configuration matrixes including a P×P unit matrix, a P×P semi unit matrix obtained by setting the value of each of one or more matrix elements of said P×P unit matrix from 1 to 0, a P×P shift matrix obtained as a result of carrying out a cyclic shift operation on said P×P unit matrix or said P×P semi unit matrix, a P×P sum matrix obtained by carrying out a matrix addition operation on at least two of said P×P unit matrix, said P×P semi unit matrix and said P×P shift matrix and a P×P zero matrix or expressed by a first post-rearrangement matrix obtained by rearranging at least one row and one column in said first original parity check matrix as a matrix having said first structure where notation P denotes an integer; or
a second format expressed by a second original parity check matrix having a second structure obtained by combining a plurality of second configuration matrixes including a Q×Q unit matrix, a Q×Q semi unit matrix obtained by setting the value of each of one or more matrix elements of said Q×Q unit matrix from 1 to 0, a Q×Q shift matrix obtained as a result of carrying out a cyclic shift operation on said Q×Q unit matrix or said Q×Q semi unit matrix, a Q×Q sum matrix obtained by carrying out a matrix addition operation on at least two of said Q×Q unit matrix, said Q×Q semi unit matrix and said Q×Q shift matrix and a Q×Q zero matrix or expressed by a second post-rearrangement matrix obtained by rearranging at least one row and one column in said second original parity check matrix as a matrix having said second structure where notation Q denotes an integer having a non-unity measure F common to said integers Q and P,
said decoding apparatus including a programmed computer whereby, in order to decode received values each obtained as a result of receiving said LDPC code in said first or second format, said said computer is programmed to execute the step of
concurrently carrying out F check-node processes as processes of F check nodes respectively or concurrently carrying out F variable-node processes as processes of F variable nodes respectively.

5. A non-transitory computer readable storage medium on which is recorded a program to be executed by a computer for controlling a decoding apparatus for decoding an LDPC (Low Density Parity Check) code received in:
a first format expressed by a first original parity check matrix having a first structure obtained by combining a plurality of first configuration matrixes including a P×P unit matrix, a P×P semi unit matrix obtained by setting the value of each of one or more matrix elements of said P×P unit matrix from 1 to 0, a P×P shift matrix obtained as a result of carrying out a cyclic shift operation on said P×P unit matrix or said P×P semi unit matrix, a P×P sum matrix obtained by carrying out a matrix addition operation on at least two of said P×P unit matrix, said P×P semi unit matrix and said P×P shift matrix and a P×P zero matrix or expressed by a first post-rearrangement matrix obtained by rearranging at least one row and one column in said first original parity check matrix as a matrix having said first structure where notation P denotes an integer; or
a second format expressed by a second original parity check matrix having a second structure obtained by combining a plurality of second configuration matrixes including a Q×Q unit matrix, a Q×Q semi unit matrix obtained by setting the value of each of one or more matrix elements of said Q×Q unit matrix from 1 to 0, a Q×Q shift matrix obtained as a result of carrying out a cyclic shift operation on said Q×Q unit matrix or said Q×Q semi unit matrix, a Q×Q sum matrix obtained by carrying out a matrix addition operation on at least two of said Q×Q unit matrix, said Q×Q semi unit matrix and said Q×Q shift matrix and a Q×Q zero matrix or expressed by a second post-rearrangement matrix obtained by rearranging at least one row and one column in said second original parity check matrix as a matrix having said second structure where notation Q denotes an integer having a non-unity measure F common to said integers Q and P,
wherein said program decodes received values each obtained as a result of receiving said LDPC code in said first or second format by
concurrently carrying out F check-node processes as processes of F check nodes respectively or concurrently carrying out F variable-node processes as processes of F variable nodes respectively.

6. A data transmitting/receiving system wherein:
an LDPC (Low Density Parity Check) code to be used as an error correction code has a format that can be expressed by an original parity check matrix having a structure obtained by combining a plurality of configuration matrixes including an $\alpha \times \alpha$ unit matrix, an $\alpha \times \alpha$ semi unit matrix obtained by setting the value of each of one or more matrix elements of said $\alpha \times \alpha$ unit matrix from 1 to 0, an $\alpha \times \alpha$ shift matrix obtained as a result of carrying out a cyclic shift operation on said $\alpha \times \alpha$ a unit matrix or said $\alpha \times \alpha$ semi unit matrix, an $\alpha \times \alpha$ sum matrix obtained by carrying out a matrix addition operation on at least two of said $\alpha \times \alpha$ unit matrix, said $\alpha \times \alpha$ semi unit matrix and said $\alpha \times \alpha$ shift matrix and an $\alpha \times \alpha$ zero matrix or expressed by a post-rearrangement matrix obtained by rearranging at least one row and one column in said original parity check matrix as a matrix having said structure where notation $\alpha$ denotes any integer other than 1;
said system including a computer programmed to select K integers among a plurality of different integers each equal to a multiple of an integer F other than 1 where notation K denotes an integer at least equal to 2;

said computer programmed to use each of said selected K integers as said integer α to provide LDPC codes of K different types; and said computer programmed to use each of said LDPC codes of said K different types as an error correction code.

7. A data receiving apparatus employed by a data transmitting/receiving system wherein:

an LDPC (Low Density Parity Check) code to be used as an error correction code has a format that can be expressed by an original parity check matrix having a structure obtained by combining a plurality of configuration matrixes including an α×α unit matrix, an α×α semi unit matrix obtained by setting the value of each of one or more matrix elements of said α×α unit matrix from 1 to 0, an α×α shift matrix obtained as a result of carrying out a cyclic shift operation on said α×α a unit matrix or said α×α semi unit matrix, an α×α sum matrix obtained by carrying out a matrix addition operation on at least two of said α×α unit matrix, said α×α semi unit matrix and said α×α shift matrix and an α×α zero matrix or expressed by a post-rearrangement matrix obtained by rearranging at least one row and one column in said original parity check matrix as a matrix having said structure where notation α denotes any integer other than 1;

said apparatus including a computer programmed to select K integers among a plurality of different integers each equal to a multiple of an integer F other than 1 where notation K denotes an integer at least equal to 2;

said computer programmed to use each of said selected K integers as said integer α to provide LDPC codes of K different types; and said computer programmed to use each of said LDPC codes of said K different types as an error correction code, said said computer being programmed to operate as a decoding means for decoding received values each obtained as a result of receiving said LDPC code of one of said K different types as an LDPC code, which has said format with said integer a set at one of said K integers, by carrying out at least F check-node processes concurrently as processes of F check nodes respectively or F variable-node processes concurrently as processes of F variable nodes respectively.

8. A data receiving method to be adopted by a data receiving apparatus employed by a data transmitting/receiving system wherein:

an LDPC (Low Density Parity Check) code to be used as an error correction code has a format that can be expressed by an original parity check matrix having a structure obtained by combining a plurality of configuration matrixes including an α×α unit matrix, an α×α semi unit matrix obtained by setting the value of each of one or more matrix elements of said α×α a unit matrix from 1 to 0, an α×α shift matrix obtained as a result of carrying out a cyclic shift operation on said α×α unit matrix or said α×α semi unit matrix, an α×α sum matrix obtained by carrying out a matrix addition operation on at least two of said α×α unit matrix, said α×α semi unit matrix and said α×α shift matrix and an α×α zero matrix or expressed by a post-rearrangement matrix obtained by rearranging at least one row and one column in said original parity check matrix as a matrix having said structure where notation a denotes any integer other than 1;

wherein said method is performed by a computer proerammed to select K integers among a plurality of different integers each equal to a multiple of an integer F other than 1 where notation K denotes an integer at least equal to 2;

said computer being further programmed to use each of said selected K integers as said integer α to provide LDPC codes of K different types; and said computer being additionally programmed to use each of said LDPC codes of said K different types as an error correction code, said data receiving method including the step of decoding received values each obtained as a result of receiving said LDPC code of one of said K different types as an LDPC code, which has said format with said integer α set at one of said K integers, by carrying out at least F check-node processes concurrently as processes of F check nodes respectively or F variable-node processes concurrently as processes of F variable nodes respectively.

* * * * *